(12) United States Patent
Song et al.

(10) Patent No.: US 12,034,047 B2
(45) Date of Patent: Jul. 9, 2024

(54) SEMICONDUCTOR DEVICE INCLUDING OXIDE SEMICONDUCTOR LAYER

(71) Applicant: SAMSUNG ELECTRONICS CO., LTD., Suwon-si (KR)

(72) Inventors: Woo Bin Song, Hwaseong-si (KR); Sang Woo Lee, Seoul (KR); Min Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/056,954

(22) Filed: Nov. 18, 2022

(65) Prior Publication Data

US 2023/0081793 A1   Mar. 16, 2023

Related U.S. Application Data

(63) Continuation of application No. 16/796,273, filed on Feb. 20, 2020, now Pat. No. 11,532,707.

(30) Foreign Application Priority Data

Jun. 10, 2019 (KR) .................. 10-2019-0067692

(51) Int. Cl.
*H01L 29/51* (2006.01)
*H01L 29/08* (2006.01)
(Continued)

(52) U.S. Cl.
CPC .......... *H01L 29/0847* (2013.01); *H01L 29/24* (2013.01); *H01L 29/267* (2013.01);
(Continued)

(58) Field of Classification Search
CPC ........... H01L 29/41783; H01L 29/7869; H01L 27/1225; H01L 29/66545; H01L 29/6656;
(Continued)

(56) References Cited

U.S. PATENT DOCUMENTS 7,732,285 B2   6/2010  Sell et al.
8,445,902 B2   5/2013  Sato et al.
(Continued)

FOREIGN PATENT DOCUMENTS

JP   2006-005092   1/2006
JP   2015-144175   8/2015
(Continued)

OTHER PUBLICATIONS

Office Action dated Dec. 8, 2023 in related Korean Patent Application No. 10-2019-0067692, 9 pages, in Korean.

*Primary Examiner* — Eric A. Ward
(74) *Attorney, Agent, or Firm* — F. CHAU & ASSOCIATES, LLC

(57) ABSTRACT

Aspects of the present inventive concept provide a semiconductor device capable of enhancing performance and reliability through source/drain engineering in a transistor including an oxide semiconductor layer. The semiconductor device includes a substrate, a metal oxide layer disposed on the substrate, a source/drain pattern being in contact with the metal oxide layer and including a portion protruding from a top surface of the metal oxide layer, a plurality of gate structures disposed on the metal oxide layer with the source/drain pattern interposed therebetween and each including gate spacers and an insulating material layer, the insulating material layer being in contact with the metal oxide layer, and not extending along a top surface of the source/drain pattern, and a contact disposed on the source/drain pattern, the contact being connected to the source/drain pattern.

19 Claims, 21 Drawing Sheets

(51) Int. Cl.
  *H01L 29/24* (2006.01)
  *H01L 29/267* (2006.01)
  *H01L 29/417* (2006.01)
  *H01L 29/45* (2006.01)
  *H01L 29/786* (2006.01)

(52) U.S. Cl.
  CPC .. *H01L 29/41733* (2013.01); *H01L 29/41775* (2013.01); *H01L 29/45* (2013.01); *H01L 29/516* (2013.01); *H01L 29/517* (2013.01); *H01L 29/7869* (2013.01)

(58) Field of Classification Search
  CPC ..... H01L 29/786–78696; H01L 29/516; H01L 29/6684; H01L 29/78391
  See application file for complete search history.

(56) References Cited

U.S. PATENT DOCUMENTS

| | | | |
|---|---|---|---|
| 8,530,273 | B2 | 9/2013 | Den Boer |
| 8,841,675 | B2 | 9/2014 | Saito et al. |
| 9,166,061 | B2 | 10/2015 | Yamazaki |
| 9,997,514 | B2 | 6/2018 | Yamazaki et al. |
| 2010/0025678 | A1 | 2/2010 | Yamazaki et al. |
| 2010/0207117 | A1 | 8/2010 | Sakata et al. |
| 2011/0241091 | A1* | 10/2011 | Dubourdieu ...... H01L 29/40111 257/532 |
| 2012/0161121 | A1 | 6/2012 | Yamazaki |
| 2012/0315735 | A1 | 12/2012 | Koezuka et al. |
| 2013/0011961 | A1 | 1/2013 | Ishizuka et al. |
| 2013/0092925 | A1 | 4/2013 | Saito et al. |
| 2013/0200375 | A1 | 8/2013 | Yamazaki |
| 2017/0125591 | A1 | 5/2017 | Giles et al. |
| 2018/0006129 | A1* | 1/2018 | Xing ..................... H01L 29/516 |
| 2018/0286987 | A1* | 10/2018 | Lee ................... H01L 29/66969 |
| 2019/0043963 | A1* | 2/2019 | Baars ............... H01L 29/66628 |
| 2019/0393355 | A1* | 12/2019 | Yoo ..................... H01L 29/516 |
| 2020/0091160 | A1* | 3/2020 | Ino ......................... H10B 53/30 |
| 2020/0357923 | A1 | 11/2020 | Yamazaki et al. |
| 2020/0388679 | A1 | 12/2020 | Song et al. |

FOREIGN PATENT DOCUMENTS

| | | |
|---|---|---|
| JP | 6139952 | 5/2017 |
| KR | 10-2010-0014164 A | 2/2010 |
| KR | 10-2012-0137463 A | 12/2012 |
| KR | 10-2013-0006310 A | 1/2013 |
| KR | 10-2017-0062079 A | 6/2017 |

* cited by examiner

SEMICONDUCTOR DEVICE INCLUDING OXIDE SEMICONDUCTOR LAYER

CROSS-REFERENCE TO RELATED APPLICATION

This application is a continuation of U.S. application Ser. No. 16/796,273, filed on Feb. 20, 2020, which claims priority under 35 U.S.C. § 119 to Korean Patent Application No. 10-2019-0067692, filed on Jun. 10, 2019, in the Korean Intellectual Property Office, the contents of which are herein incorporated by reference in their entirety.

TECHNICAL FIELD

The present inventive concept relates to a semiconductor device, and more particularly, to a semiconductor device including an oxide semiconductor layer.

DISCUSSION OF RELATED ART

As a silicon layer used as a semiconductor layer of a transistor, an amorphous silicon layer or a polycrystalline silicon layer is used depending on the purpose. When the transistor is included in a large display device, an amorphous silicon layer capable of having relatively uniform characteristics even when formed in a large area may be used.

On the other hand, when the transistor is included in a driving circuit and the like, a polycrystalline silicon layer capable of exhibiting high field-effect mobility may be used. To form the polycrystalline silicon layer, high-temperature heat treatment or a laser light treatment may be applied on an amorphous silicon layer.

Recently, the use of an oxide semiconductor as a channel layer of a transistor has been proposed. However, hydrogen can easily diffuse into the oxide semiconductor layer during the fabrication and/or post-annealing processes, and as a result, degradation of transistor performance due to short channel effect may occur.

SUMMARY

Aspects of the present inventive concept provide a semiconductor device capable of enhancing performance and reliability through source/drain engineering in a transistor including an oxide semiconductor layer.

Aspects of the present inventive concept also provide a semiconductor device capable of enhancing performance by using an insulating layer having ferroelectric characteristics in a gate structure in a transistor including an oxide semiconductor layer.

However, aspects of the present inventive concept are not restricted to those set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a semiconductor device including a substrate, a metal oxide layer disposed on the substrate, a source/drain pattern being in contact with the metal oxide layer and including a portion protruding from a top surface of the metal oxide layer, a plurality of gate structures disposed on the metal oxide layer with the source/drain pattern interposed therebetween and each including gate spacers and an insulating material layer, the insulating material layer being in contact with the metal oxide layer, and not extending along a top surface of the source/drain pattern, and a contact disposed on the source/drain pattern, the contact being connected to the source/drain pattern.

According to an aspect of the present inventive concept, there is provided a semiconductor device including a substrate, a metal oxide layer disposed on the substrate, a plurality of gate structures spaced apart from each other and disposed on the metal oxide layer, a source/drain pattern disposed between the gate structures, the source/drain pattern being connected to the metal oxide layer and including at least one of an element semiconductor material pattern and a group IV-IV compound semiconductor material pattern, and a contact disposed on the source/drain pattern, the contact being connected to the source/drain pattern.

According to an aspect of the present inventive concept, there is provided a semiconductor device including a silicon substrate, a buffer insulating layer disposed on the silicon substrate, the buffer insulating layer extending along a top surface of the silicon substrate, a metal oxide layer disposed on the buffer insulating layer, the metal oxide layer including In—Ga—Zn-based oxide, a plurality of gate structures spaced apart from each other, each of the gate structures including a gate electrode and a capping pattern on the gate electrode, a source/drain pattern disposed between the gate structures, the source/drain pattern being in contact with the metal oxide layer and including sidewall portions extending along sidewalls of the gate structures and a bottom portion extending along the top surface of the silicon substrate, an interlayer insulating layer covering the source/drain pattern and the gate structures and including a contact hole exposing at least a portion of the source/drain pattern, and a contact filling the contact hole and connected to the source/drain pattern.

According to an aspect of the present inventive concept, there is provided a semiconductor device including a substrate, a metal oxide layer disposed on the substrate, a gate structure disposed on the metal oxide layer, the gate structure including an insulating material layer and a gate electrode disposed on the insulating material layer, the insulating material layer including a ferroelectric material layer, an interlayer insulating layer covering the gate structure and disposed on the metal oxide layer, and a contact disposed in the interlayer insulating layer and connected to the metal oxide layer.

BRIEF DESCRIPTION OF THE DRAWINGS

The above and other aspects and features of the present inventive concept will become more apparent by describing in detail exemplary embodiments thereof with reference to the accompanying drawings, in which.

Figure 1:
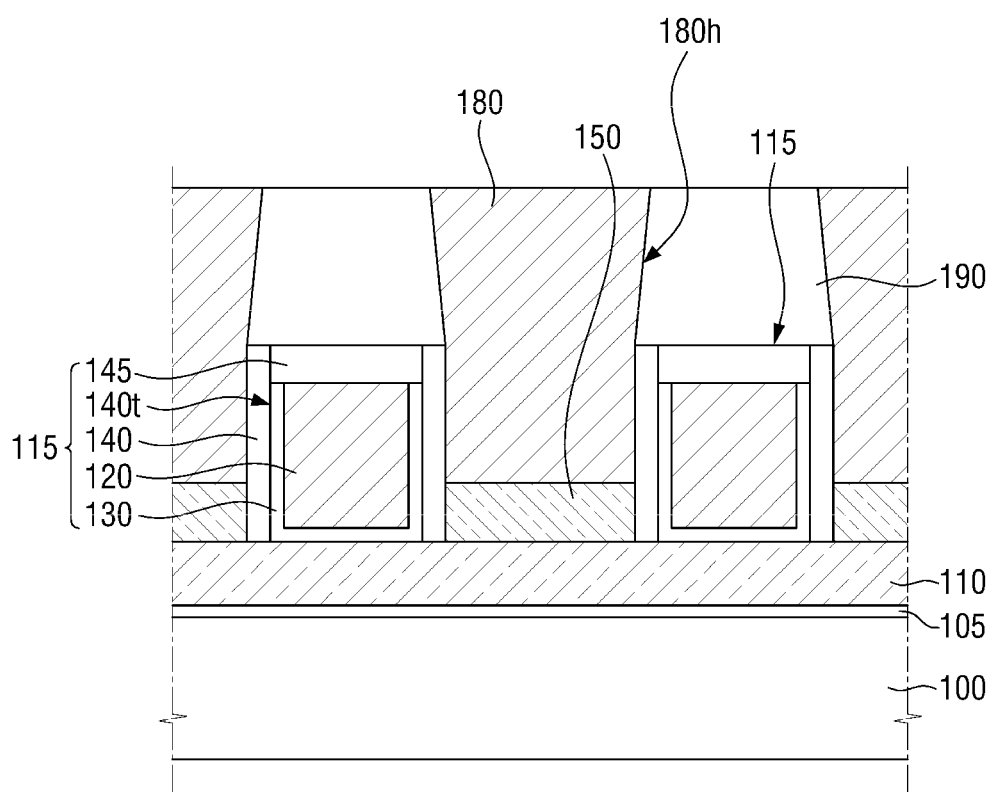
FIG. 1 is a diagram illustrating a semiconductor device according to an exemplary embodiment of the present inventive concept.

Since the drawings in FIGS. 1-21 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

In each of the drawings of a semiconductor device according to an exemplary embodiment of the present inventive concept, a planar transistor is illustrated as an example, but the present inventive concept is not limited thereto. A semiconductor device according to an exemplary embodiment of the present inventive concept may include a fin-type transistor (FinFET) including a channel region having a fin-type pattern shape, a transistor including nanowires, a transistor including a nanosheet, or a three-dimensional (3D) transistor. Further, the semiconductor device according to an exemplary embodiment of the present inventive concept may include a bipolar junction transistor (BJT), a lateral double-diffused metal-oxide semiconductor (MOS) (LD-MOS) transistor, or the like.

FIG. 1 is a diagram illustrating a semiconductor device according to an exemplary embodiment of the present inventive concept.

Referring to FIG. 1, a semiconductor device according to an exemplary embodiment of the present inventive concept may include a substrate 100, a metal oxide layer 110, first gate structures 115, a first source/drain pattern 150 and a contact 180.

The substrate 100 may be a bulk silicon (Si) substrate or a silicon-on-insulator (SOI) substrate. Alternatively, the substrate 100 may be a silicon substrate including silicon (Si), for example, single crystalline silicon (Si), polycrystalline silicon (Si), amorphous silicon (Si), or a combination thereof, and/or may include other materials such as silicon germanium (SiGe), silicon germanium on insulator (SGOI), indium antimonide (InSb), a lead tellurium compound (PbTe), gallium phosphide (GaP), indium arsenide (InAs), indium phosphide (InP), gallium arsenide (GaAs), or gallium antimonide (GaSb). Alternatively, the substrate 100 may include a glass substrate, a ceramic substrate, or a quartz substrate, or may include an organic substrate having heat resistance enough to withstand heat treatment of a semiconductor process. For example, the organic substrate may be a plastic substrate.

The metal oxide layer 110 may be disposed on the substrate 100, and may be used as a channel region of a transistor. In other words, the metal oxide layer 110 may be a channel layer of a transistor. The metal oxide layer 110 may have semiconductor characteristics, and may be, for example, a metal oxide semiconductor layer. In an exemplary embodiment of the present inventive concept, to have the semiconductor characteristics, the metal oxide layer 110 may be formed to contain no hydrogen (H), which may be an n-type impurity. For example, the metal oxide semiconductor layer may be formed to be pure and impurities free (e.g., free of hydrogen (H) or including insignificant amount of hydrogen (H)) so as to have intrinsic semiconducting property, and thus the transistor including the pure metal oxide semiconductor layer as the channel region may be electrically stable. Incorporating impurities into the metal oxide semiconductor layer may change its semiconductor characteristics to conductor characteristics.

The metal oxide layer 110 includes a first surface and a second surface facing each other. The second surface of the metal oxide layer 110 may face the substrate 100.

As an example, the metal oxide layer 110 may be an amorphous metal oxide layer. As another example, the metal oxide layer 110 may be a polycrystalline metal oxide layer. As still another example, the metal oxide layer 110 may be formed by combining an amorphous metal oxide layer and a polycrystalline metal oxide layer. For example, the metal oxide layer 110 may include one of amorphous metal oxide, polycrystalline metal oxide and a combination thereof.

The metal included in the metal oxide layer 110 may include, for example, indium (In), tin (Sn), zinc (Zn), aluminum (Al), magnesium (Mg), gallium (Ga), hafnium (Hf), lanthanum (La), praseodymium (Pr), cesium (Ce), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or a combination thereof, but the present inventive concept is not limited thereto. The metal oxide layer 110 may include one of, for example, indium oxide ($In_2O_3$), tin oxide ($SnO_2$), zinc oxide (ZnO), In—Zn-based oxide (IZO), Sn—Zn-based oxide, Al—Zn-based oxide, Zn—Mg-based oxide, Sn—Mg-based oxide, In—Mg-based oxide, In—Ga-based oxide (IGO), In—Ga—Zn-based oxide (IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide, but the present inventive concept is not limited thereto.

As used herein, the term "In—Ga—Zn-based oxide" refers to oxide containing In, Ga, and Zn as its main components and there is no particular limitation on the ratio of In:Ga:Zn. The In—Ga—Zn-based oxide may contain doped metal elements other than In, Ga and Zn. Other terms of metal oxides described above may also be defined similarly to the term "In—Ga—Zn-based oxide" being defined here.

As an example, the metal oxide layer 110 may include one of, for example, In—Ga-based oxide, In—Zn-based oxide and In—Ga—Zn-based oxide. For example, the metal oxide layer 110 may include In—Ga—Zn-based oxide.

A buffer insulating layer 105 may be disposed on the substrate 100, and may be disposed between the substrate 100 and the metal oxide layer 110. The buffer insulating layer 105 may be disposed between the top surface of the substrate 100 and a second surface of the metal oxide layer 110, and may extend along the top surface of the substrate 100.

The buffer insulating layer 105 may be an insulating layer which prevents or suppresses the diffusion of an impurity element such as hydrogen (H) (including water ($H_2O$), a hydroxyl (—OH) group or the like) from the substrate 100 into the metal oxide layer 110. Also, impurities such as hydrogen (H), water ($H_2O$), a hydroxyl group (—OH), or hydride ($H^-$) may be intentionally removed from the metal oxide layer 110 during the process of forming the metal oxide layer 110, or through a heat treatment process and/or an oxidation process after the metal oxide layer 110 is formed. The buffer insulating layer 105 may include one of, for example, a silicon oxide ($SiO_2$) layer, a silicon oxynitride (SiON) layer, a silicon nitride ($Si_3N_4$) layer, an aluminum oxide ($Al_2O_3$) layer, an aluminum oxynitride (AlON) layer and a combination thereof.

The plurality of first gate structures 115 may be disposed on the metal oxide layer 110, for example, on a first surface of the metal oxide layer 110.

The plurality of first gate structures 115 may be spaced apart from each other. The first gate structures 115 spaced apart from each other may be disposed with the first source/drain pattern 150 interposed therebetween. For example, the first source/drain pattern 150 may be interposed between two adjacent ones of the first gate structures 115. The metal oxide layer 110 may be disposed between each of the first gate structures 115 and the substrate 100. For example, the metal oxide layer 110 may be disposed between each of the first gate structures 115 and the buffer insulating layer 105.

Each of the first gate structures 115 may include a gate electrode 120, a first insulating material layer 130, gate spacers 140 and a capping pattern 145.

The gate spacers 140 may be disposed on the metal oxide layer 110. Although it is illustrated that the gate spacers 140 are formed as a single layer, the gate spacers 140 may be formed as a multilayer without being limited thereto.

The gate spacers 140 may include at least one of, for example, silicon nitride ($Si_3N_4$), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC) and a combination thereof. In an exemplary embodiment of the present inventive concept, some multilayer structures such as, for example, oxide/nitride/oxide (ONO) or oxide/nitride/oxide/nitride (ONON) for the gate spacers 140 may be used to enhance the resistivity strength. Here the oxide may be silicon oxide ($SiO_2$), and the nitride may be silicon nitride ($Si_3N_4$).

In some cases, the gate spacers 140 may serve as a guide for forming a self-aligned contact. Thus, the gate spacers 140 may include a material having an etch selectivity with respect to an interlayer insulating layer 190 to be described later.

A gate trench 140t may be defined by the gate spacers 140. For example, with regard to the gate trench 140t, the gate spacers 140 may serve as sidewalls of the trench, and the first surface of the metal oxide layer 110 may serve as a bottom surface of the trench.

The first insulating material layer 130 may be disposed on the metal oxide layer 110, and may be in contact with the metal oxide layer 110. The first insulating material layer 130 may be formed along the sidewalls and bottom surface of the gate trench 140t. For example, the first insulating material layer 130 may be used as a gate insulating layer.

The first insulating material layer 130 may include at least one of, for example, silicon oxide ($SiO_2$), silicon oxynitride (SiON), silicon nitride ($Si_3N_4$), and a high dielectric constant material having a dielectric constant higher than that of silicon oxide ($SiO_2$). The high dielectric constant material may include at least one selected from, for example, hafnium oxide ($HfO_2$), hafnium silicon oxide ($HfSiO_4$), hafnium aluminum oxide ($HfAlO_3$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc, Ta)O_3$) and lead zinc niobate ($Pb(Zn_{1/3}Nb_{2/3})O_3$).

Although it is illustrated that the first insulating material layer 130 is a single layer, the present inventive concept is not limited thereto. For example, in an exemplary embodiment of the present inventive concept, to enhance resistance to thermal stress and bias stress, and to have long life reliability, the first insulating material layer 130 may be a multilayer gate insulating film having, for example, an oxide/nitride/oxide (ONO) structure or an oxide/nitride/oxide/nitride (ONON) structure. In an exemplary embodiment of the present inventive concept, the first insulating material layer 130 may include a combination of a high dielectric constant insulating material layer and an interfacial insulating material layer formed at an interface with the metal oxide layer 110.

The gate electrode 120 may be disposed on the first insulating material layer 130. The gate electrode 120 may be disposed between the gate spacers 140, and may fill a portion of the gate trench 140t.

The gate electrode 120 may include at least one selected from, for example, titanium nitride (TiN), tantalum carbide (TaC), tantalum nitride (TaN), titanium silicon nitride (Ti- SiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof. The gate electrode 120 may each include conductive metal oxide, conductive metal oxynitride or the like, and may include an oxidized form of the aforementioned material.

The gate electrode 120 may be formed through, for example, a replacement process (or a gate last process), but the present inventive concept is not limited thereto.

The capping pattern 145 may be disposed on the gate electrode 120, and may fill the remaining portion of the gate trench 140t after the gate electrode 120 and the first insulating material layer 130 are formed. To form the capping pattern 145, the gate spacers 140 may be previously formed, and then the first insulating material layer 130 and the gate electrode 120 may be filled in the gate trench 140t between opposite gate spacers 140. Thereafter, portions of the first insulating material layer 130 and the gate electrode 120 may be removed to form a recess, and then the recess may be filled with an insulating material to form the capping pattern 145. Although it is illustrated that the first insulating material layer 130 is not formed between the gate spacers 140 and the capping pattern 145, it is merely for convenience of description and the present inventive concept is not limited thereto. For example, in an exemplary embodiment of the present inventive concept, the first insulating material layer 130 may be formed between the gate spacers 140 and the capping pattern 145. In this case, only portions of the gate electrode 120 may be removed to form a recess, and then the recess may be filled with an insulating material to form the capping pattern 145 with the first insulating material layer 130 interposed between the gate spacers 140 and the capping pattern 145.

Although it is illustrated in FIG. 1 that the capping pattern 145 is formed between inner sidewalls of the gate spacers 140, the present inventive concept is not limited thereto. For example, the top surfaces of the gate spacers 140 may also be recessed toward the substrate 100 similarly to the gate electrode 120. In this case, the capping pattern 145 may be formed on the top surfaces of the gate spacers 140 and the top surface of the gate electrode 120.

The capping pattern 145 may include, for example, a material having an etch selectivity with respect to the interlayer insulating layer 190. The capping pattern 145 may include at least one of, for example, silicon nitride ($Si_3N_4$), silicon oxynitride (SiON), silicon oxide ($SiO_2$), silicon carbonitride (SiCN), silicon oxycarbonitride (SiOCN), and a combination thereof.

The first source/drain pattern 150 may be disposed between two adjacent ones of the first gate structures 115, and may be in contact with the first gate structures 115. For example, the first source/drain pattern 150 may be in contact with the gate spacers 140 of the first gate structures 115.

The first source/drain pattern 150 may be connected to the metal oxide layer 110. For example, the first source/drain pattern 150 may be in contact with the metal oxide layer 110. The first insulating material layer 130 does not extend along the top surface of the first source/drain pattern 150.

At least a portion of the first source/drain pattern 150 may protrude upward from the first surface of the metal oxide layer 110. For example, the first source/drain pattern 150 may be a raised source/drain layer. That is, at least a portion of the first source/drain pattern 150 may protrude upward from the boundary between the metal oxide layer 110 and the first insulating material layer 130. The top surface of the first source/drain pattern 150 is higher than the first surface of the metal oxide layer 110. In contrast to conventional source/drains, raised source/drains are vertical structures formed on top of the substrate instead of implanted structures in the substrate. Here, conventional source/drains would be formed below the first surface of the metal oxide layer 110.

In a semiconductor device according to an exemplary embodiment of the present inventive concept, the first source/drain pattern 150 may be disposed on the first surface of the metal oxide layer 110. The first source/drain pattern 150 may be included in a source/drain of a transistor using the metal oxide layer 110 as a channel region, and may be included in an elevated source/drain (i.e., a raised source/drain).

The first source/drain pattern 150 may include at least one of, for example, a conductive oxide pattern, an element semiconductor material pattern and a group IV-IV compound semiconductor material pattern. The conductive oxide pattern may include one of, for example, indium tin oxide (ITO), indium zinc oxide (IZO) and InGaSiO, but the present inventive concept is not limited thereto. The term "InGaSiO" refers to containing In, Ga, Si and O as its main components and there is no particular limitation on the ratio of In:Ga:Si:O. For example, the indium gallium silicon oxide (InGaSiO) may have a chemical formula that conforms to stoichiometry, or may have a chemical formula that does not conform to stoichiometry. Also, in many instances, indium tin oxide (ITO) or the like may be described as indium-doped tin oxide, and is categorized as a transparent conductive oxide (TCO).

The element semiconductor material pattern may be one of, for example, a silicon (Si) pattern and a germanium (Ge) pattern. The group IV-IV compound semiconductor material pattern may include a binary compound or a ternary compound including at least two of, for example, carbon (C), silicon (Si), germanium (Ge) and tin (Sn), or a compound obtained by doping the above-mentioned compound with group IV elements. For example, the group IV-IV compound semiconductor material pattern may be one of silicon germanium (SiGe) and silicon carbide (SiC), but the present inventive concept is not limited thereto.

The first source/drain pattern 150 may include a dopant doped into the first source/drain pattern 150. The dopant may include at least one of, for example, phosphorus (P), arsenic (As), antimony (Sb) and boron (B). For example, the dopant may be included in the element semiconductor material pattern or the group IV-IV compound semiconductor material pattern of the first source/drain pattern 150. For example, the dopant may be included in the element semiconductor material pattern or the group IV-IV compound semiconductor material pattern to modulate electrical properties, and may convert an intrinsic semiconductor property of the element semiconductor material pattern or the group IV-IV compound semiconductor material pattern into a conductor property.

The first source/drain pattern 150 may be formed by physical vapor deposition (PVD) or chemical vapor deposition (CVD).

The interlayer insulating layer 190 may be disposed on the metal oxide layer 110, and may cover the first source/drain pattern 150 and the first gate structure 115. The interlayer insulating layer 190 may include a contact hole 180h exposing at least a portion of the first source/drain pattern 150.

The interlayer insulating layer 190 may include at least one of, for example, silicon oxide ($SiO_2$), silicon nitride ($Si_3N_4$), silicon oxynitride (SiON) and a low dielectric constant material. The low dielectric constant material may include, for example, flowable oxide (FOX), tonen silazene (TOSZ), undoped silicate glass (USG), borosilicate glass (BSG), phosphosilicate glass (PSG), borophosphosilicate glass (BPSG), plasma enhanced tetra ethyl ortho silicate (PETEOS), fluoride silicate glass (FSG), carbon doped silicon oxide (CDO), Xerogel, Aerogel, amorphous fluorinated carbon, organo silicate glass (OSG), parylene, bis-benzocyclobutene (BCB), SiLK, polyimide, a porous polymeric material, or a combination thereof, but the present inventive concept is not limited thereto. In an exemplary embodiment of the present inventive concept, the interlayer insulating layer 190 may include an ultralow k dielectric material which includes silicon (Si), carbon (C), oxygen (O) and hydrogen (H), and a multiplicity of nanometer-sized pores.

Although it is illustrated that the interlayer insulating layer 190 is a single layer, the present inventive concept is not limited thereto. For example, the interlayer insulating layer 190 may include a plurality of layers.

The contact 180 may be formed on the first source/drain pattern 150. The contact 180 may be connected to the first source/drain pattern 150, and may fill the contact hole 180h.

Although it is illustrated in FIG. 1 that the contact 180 is a self-aligned contact formed along the sidewalls of the adjacent first gate structures 115, but the present inventive concept is not limited thereto. Although it is illustrated that the interlayer insulating layer 190 is not interposed between the sidewall of the contact 180 and the first gate structure 115, the present inventive concept is not limited thereto. That is, the contact 180 may not be in contact with at least one of the adjacent first gate structures 115. For example, the contact 180 may not be a self-aligned contact, and may be formed in a contact hole which is smaller than the contact hole 180h, is not formed along the sidewalls of the adjacent first gate structures 115, and is formed by etching through the interlayer insulating layer 190 using a patterned mask having a relatively smaller opening as an etch mask, and thus the interlayer insulating layer 190 may be interposed between the sidewall of the contact 180 and the adjacent first gate structure 115.

The contact 180 may include, for example, a conductive material. The conductive material may include at least one of a metal, a metal alloy containing two or more kinds of metals, a metal nitride, a metal carbonitride, and a conductive semiconductor material (e.g., poly-Si, and poly silicon germanium). Although it is illustrated that the contact 180 is a single layer, it is merely for convenience of description and the present inventive concept is not limited thereto.

The first source/drain pattern 150 may increase a separation distance between the contact 180 and the metal oxide layer 110. By increasing the separation distance between the contact 180 and the metal oxide layer 110, the infiltration of impurities (e.g., hydrogen (H)) into the metal oxide layer 110 along the contact 180 or the like may be reduced or suppressed. Thus, a transistor including the metal oxide layer 110 as a channel region with the infiltration of impurities such as hydrogen (H) into the metal oxide layer 110 being reduced or suppressed may be electrically stable. Accordingly, performance and reliability of the semiconductor device including the transistor may be enhanced. When impurities (e.g., hydrogen (H)) are diffused into the metal oxide layer 110, short channel effect may then occur, thereby degrading the performance of the semiconductor device.

Figure 2:
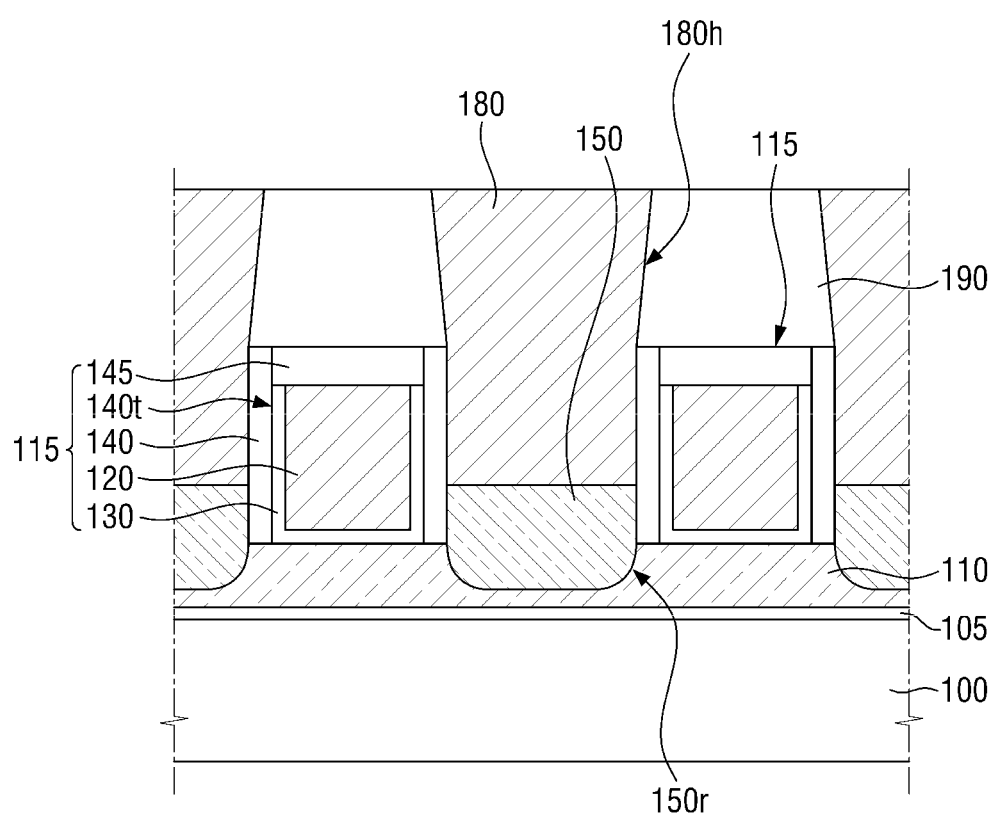
FIG. 2 is a diagram illustrating a semiconductor device according to an exemplary embodiment of the present inventive concept.
Figure 3:
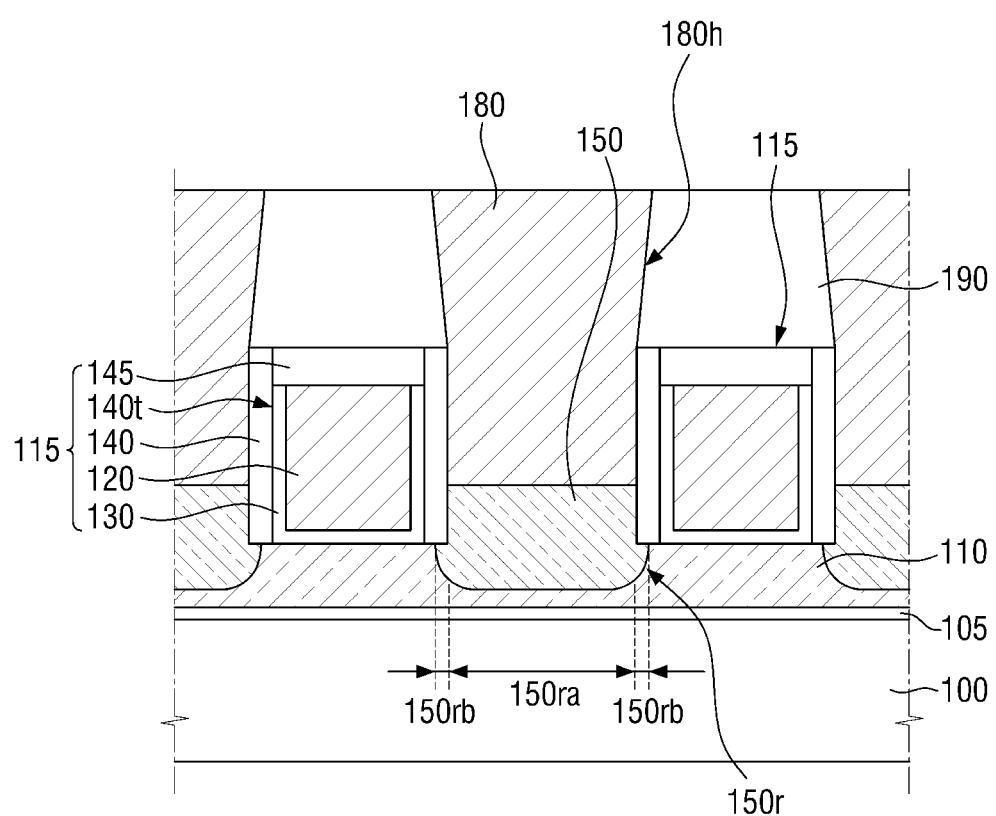
FIG. 3 is a diagram illustrating a semiconductor device according to an exemplary embodiment of the present inventive concept.

FIG. 2 is a diagram illustrating a semiconductor device according to an exemplary embodiment of the present inventive concept. FIG. 3 is a diagram illustrating a semiconductor device according to an exemplary embodiment of the present inventive concept. For simplicity of description, the following description will focus on differences from the description with reference to FIG. 1.

Referring to FIGS. 2 and 3, in a semiconductor device according to an exemplary embodiment of the present inventive concept, the metal oxide layer 110 may include a source/drain recess 150r.

The source/drain recess 150r may be formed between two adjacent ones of the first gate structures 115. For example, the source/drain recess 150r may be formed on at least one side of the gate structure 115.

A portion of the first source/drain pattern 150 may fill the source/drain recess 150r. For example, the portion of the first source/drain pattern 150 filling the source/drain recess 150r may be an embedded source/drain.

Although it is illustrated that the source/drain recess 150r is formed in the metal oxide layer 110 so as not to expose the buffer insulating layer 105, the present inventive concept is not limited thereto. As an example, a portion of the metal oxide layer 110 may be interposed between the first source/drain pattern 150 and the buffer insulating layer 105. As another example, the source/drain recess 150r may expose the buffer insulating layer 105, and the first source/drain pattern 150 may be in contact with the buffer insulating layer 105.

In FIG. 2, the sidewall of the source/drain recess 150r may be aligned with the outer sidewall of the first gate structure 115. In other words, the source/drain recess 150r may not include a portion extending below the first gate structure 115, for example, extending along bottom surfaces of the first gate structure 115. For example, the source/drain recess 150r may be formed through an anisotropic etch process.

In FIG. 3, the sidewall of the source/drain recess 150r may be located more toward the gate electrode 120 than the outer sidewall of the first gate structure 115.

A portion of the source/drain recess 150r may extend along the bottom surfaces of the gate spacers 140. In other words, the source/drain recess 150r may include a portion extending along the bottom surfaces of the gate spacers 140. For example, the source/drain recess 150r may be formed through an isotropic etch process.

The source/drain recess 150r may include a first portion 150ra and second portions 150rb. The second portions 150rb of the source/drain recess may be defined on both sides of the first portion 150ra of the source/drain recess, and may be portions extending along the bottom surfaces of the gate spacers 140. The portion of the first source/drain pattern 150 filling the source/drain recess 150r (e.g., the embedded source/drain portion) may further reduce or suppress the infiltration of impurities (e.g., hydrogen (H)) into the metal oxide layer 110 along the contact 180 or the like.

Thus, performance and reliability of the semiconductor device may be further enhanced.

Figure 4:
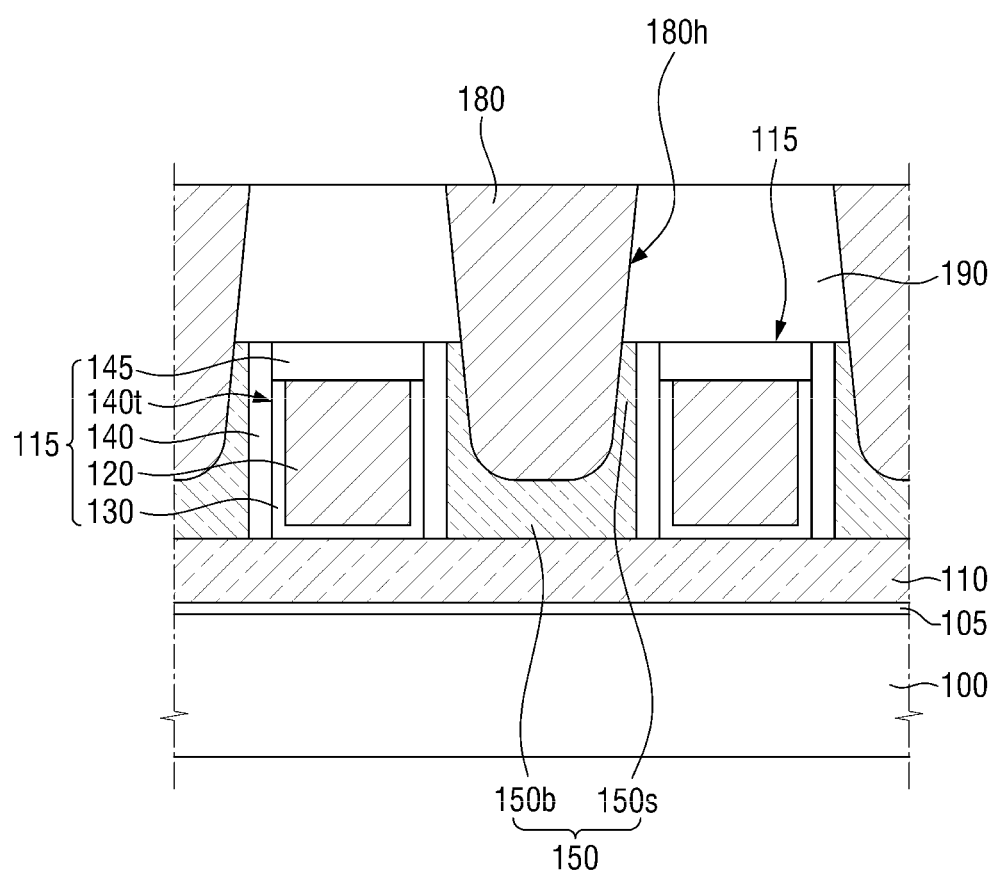
FIG. 4 is a diagram illustrating a semiconductor device according to an exemplary embodiment of the present inventive concept.
Figure 5:
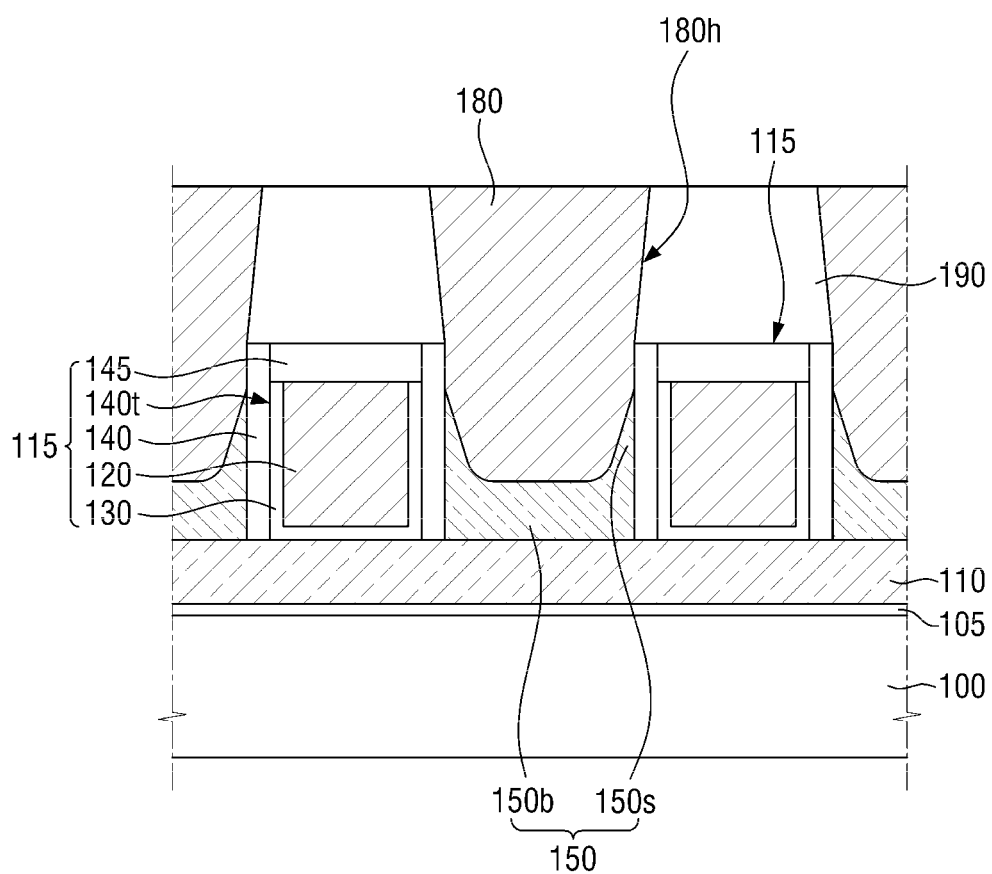
FIG. 5 is a diagram illustrating a semiconductor device according to an exemplary embodiment of the present inventive concept.

FIG. 4 is a diagram illustrating a semiconductor device according to an exemplary embodiment of the present inventive concept. FIG. 5 is a diagram illustrating a semiconductor device according to an exemplary embodiment of the present inventive concept. For simplicity of description, the following description will focus on differences from the description with reference to FIG. 1.

Referring to FIGS. 4 and 5, in a semiconductor device according to an exemplary embodiment of the present inventive concept, the first source/drain pattern 150 may include a bottom portion 150b and sidewall portions 150s.

The bottom portion 150b of the first source/drain pattern may extend along the top surface of the substrate 100. In other words, the bottom portion 150b of the first source/drain pattern may be a portion extending along the first surface of the metal oxide layer 110, which is a boundary between the first gate structures 115 and the metal oxide layer 110.

The sidewall portions 150s of the first source/drain pattern may be connected to the bottom portion 150b of the first source/drain pattern, and may extend along the sidewalls of the first gate structures 115. The sidewall portions 150s of the first source/drain pattern may be portions protruding from the bottom portion 150b of the first source/drain pattern in a thickness direction of the substrate 100.

The top surface of the first source/drain pattern 150 may have a downwardly convex shape. For example, the top surface of the first source/drain pattern 150 may have a bowl shape.

In FIG. 4, the sidewall portions 150s of the first source/drain pattern may extend to the top surfaces of the first gate structures 115. The height from the top surface of the substrate 100 to the top surface of the first gate structure 115 may be substantially the same as the height from the top surface of the substrate 100 to a top surface of the sidewall portion 150s of the first source/drain pattern. For example, the top surface of the first gate structure 115 and the top surface of the sidewall portion 150s of the first source/drain pattern may be coplanar.

Although it is illustrated that all of the sidewall portions 150s of the first source/drain pattern extending along the sidewalls of two adjacent first gate structures 115 extend to the top surfaces of the first gate structures 115, it is merely for convenience of description and the present inventive concept is not limited thereto.

In FIG. 5, the sidewall portions 150s of the first source/drain pattern do not extend to the top surfaces of the first gate structures 115. The height from the top surface of the substrate 100 to the top surface of the first gate structure 115 is greater than the height from the top surface of the substrate 100 to a top portion of the sidewall portion 150s of the first source/drain pattern. Since impurities such as hydrogen (H) may diffuse into the metal oxide layer 110 through the contact 180 and through the interface between the contact 180 and the gate spacer 140, the sidewall portions 150s of the first source/drain pattern illustrated in FIGS. 4 and 5 may further reduce or suppress the infiltration of impurities (e.g., hydrogen (H)) into the metal oxide layer 110 through the interface between the contact 180 and the gate spacer 140. Accordingly, performance and reliability of the semiconductor device may be enhanced.

Figure 6:
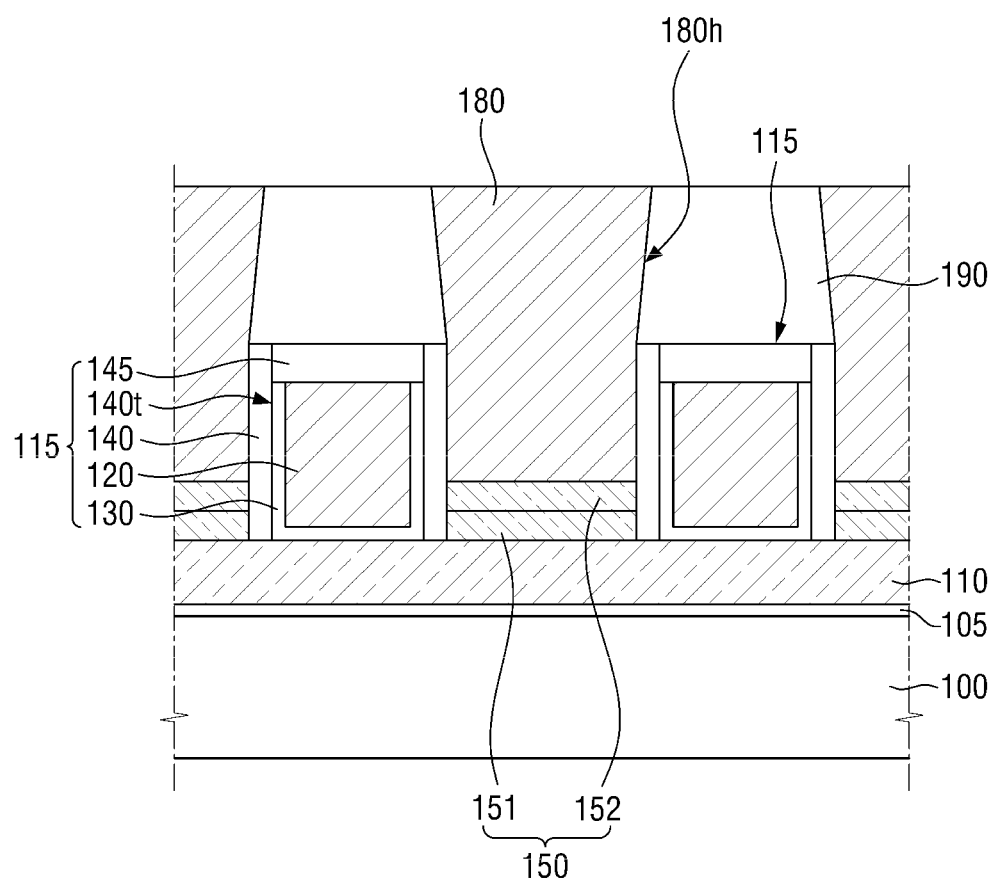
FIG. 6 is a diagram illustrating a semiconductor device according to an exemplary embodiment of the present inventive concept.
Figure 7:
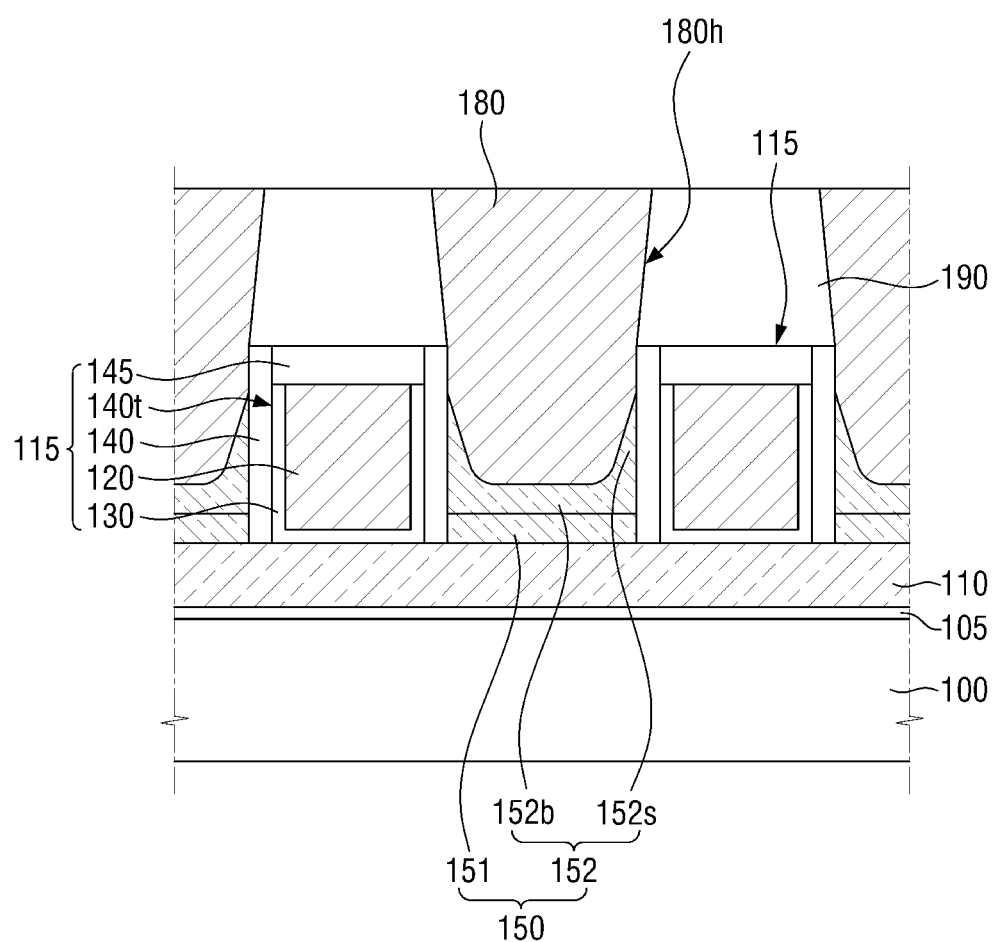
FIG. 7 is a diagram illustrating a semiconductor device according to an exemplary embodiment of the present inventive concept.
Figure 8:
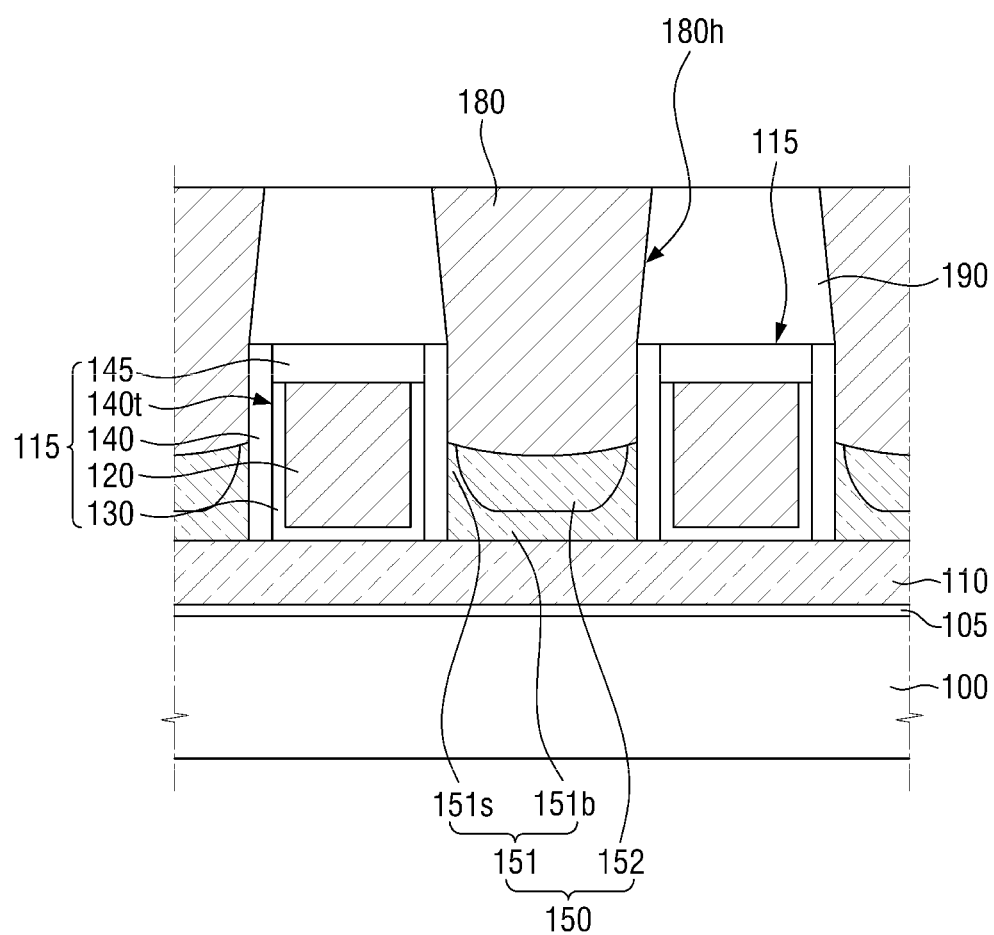
FIG. 8 is a diagram illustrating a semiconductor device according to an exemplary embodiment of the present inventive concept.
Figure 9:
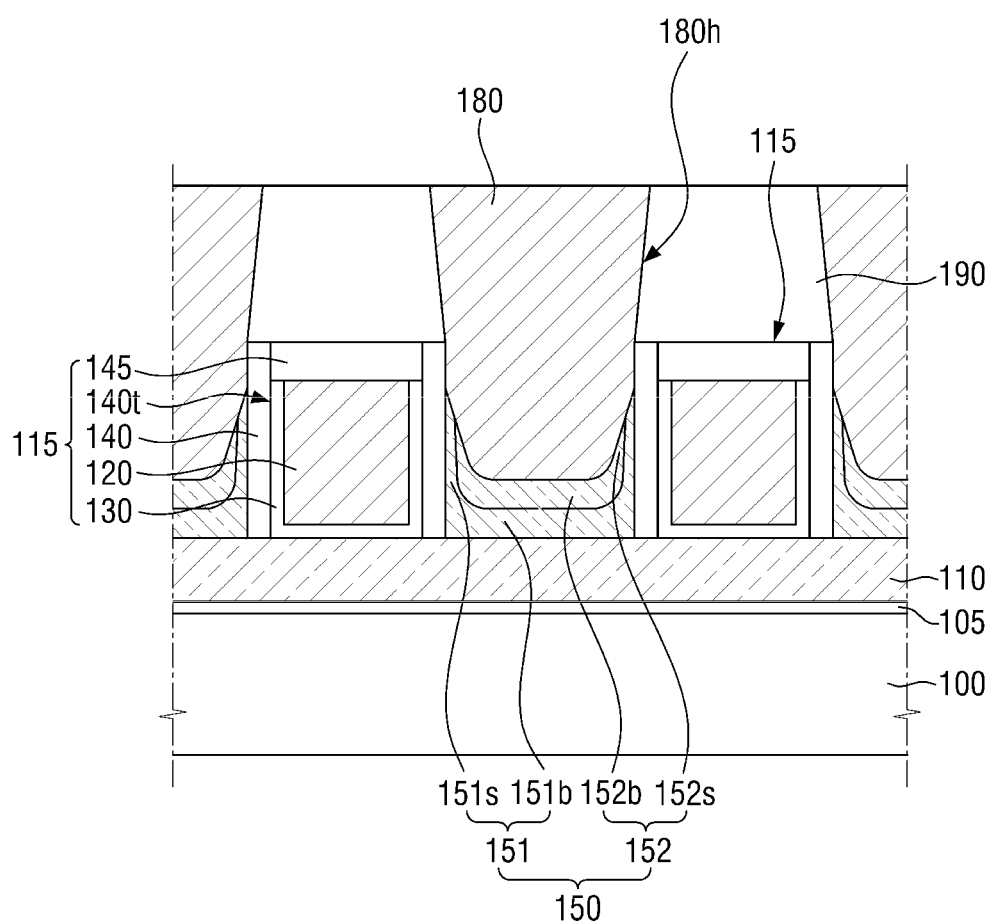
FIG. 9 is a diagram illustrating a semiconductor device according to an exemplary embodiment of the present inventive concept.

FIG. 6 is a diagram illustrating a semiconductor device according to an exemplary embodiment of the present inventive concept. FIG. 7 is a diagram illustrating a semiconductor device according to an exemplary embodiment of the present inventive concept. FIG. 8 is a diagram illustrating a semiconductor device according to an exemplary embodiment of the present inventive concept. FIG. 9 is a diagram illustrating a semiconductor device according to an exemplary embodiment of the present inventive concept. For simplicity of description, the following description will focus on differences from the description with reference to FIG. 1.

Referring to FIGS. 6 to 9, in a semiconductor device according to an exemplary embodiment of the present inventive concept, the first source/drain pattern 150 may include a lower source/drain pattern 151 and an upper source/drain pattern 152.

The upper source/drain pattern 152 may be disposed on the lower source/drain pattern 151, and may include at least one of, for example, a conductive oxide pattern, an element semiconductor material pattern and a group IV-IV compound semiconductor material pattern. The lower source/drain pattern 151 may include at least one of, for example, a conductive oxide pattern, an element semiconductor material pattern and a group IV-IV compound semiconductor material pattern.

The upper source/drain pattern 152 includes a material different from that of the lower source/drain pattern 151.

In FIG. 6, the lower source/drain pattern 151 and the upper source/drain pattern 152 may have a plate-like stacked structure.

In FIG. 7, the lower source/drain pattern 151 may have a plate-like structure. However, the upper source/drain pattern 152 may include a bottom portion 152b and sidewall portions 152s.

The bottom portion 152b of the upper source/drain pattern may extend along the top surface of the substrate 100, and may extend along the top surface of the lower source/drain pattern 151. The sidewall portions 152s of the upper source/drain pattern may be connected to the bottom portion 152b of the upper source/drain pattern, and may extend along the sidewalls of the first gate structures 115.

The top surface of the upper source/drain pattern 152 may have a downwardly convex shape. For example, the top surface of the upper source/drain pattern 152 may have a bowl shape.

In FIG. 8, the lower source/drain pattern 151 may include a bottom portion 151b and sidewall portions 151s.

The bottom portion 151b of the lower source/drain pattern may extend along the top surface of the substrate 100, and may extend along the first surface of the metal oxide layer 110. The sidewall portions 151s of the lower source/drain pattern may be connected to the bottom portion 151b of the lower source/drain pattern, and may extend along the sidewalls of the first gate structures 115.

The top surface of the lower source/drain pattern 151 may have a downwardly convex shape. For example, the top surface of the lower source/drain pattern 151 may have a bowl shape.

The upper source/drain pattern 152 may be disposed on the top surface of the lower source/drain pattern 151, and may fill a recess defined by the top surface of the bowl-shaped lower source/drain pattern 151.

The sidewall portions 151s of the lower source/drain pattern may be interposed between the upper source/drain pattern 152 and the first gate structures 115. The upper source/drain pattern 152 may not be in contact with the first gate structures 115.

In an exemplary embodiment of the present inventive concept, the upper source/drain pattern 152 may include at least one of an element semiconductor material pattern and a group IV-IV compound semiconductor material pattern. The lower source/drain pattern 151 may include a conductive oxide pattern. The conductive oxide pattern may include sidewall portions (e.g., sidewall portions 151s of the lower source/drain pattern) extending along sidewalls of the first gate structures 115, and a bottom portion (e.g., bottom portion 151b of the lower source/drain pattern) extending along the top surface of the substrate 100. The conductive oxide pattern may include at least one of indium tin oxide (ITO), indium zinc oxide (IZO) and InGaSiO.

In FIG. 9, the lower source/drain pattern 151 may include a bottom portion 151b and sidewall portions 151s.

The upper source/drain pattern 152 may include a bottom portion 152b and sidewall portions 152s, and may be formed along a recess defined by the top surface of the bowl-shaped lower source/drain pattern 151.

Impurities, such as hydrogen (H), diffusion can be controlled by applying the first source/drain pattern 150 having various source/drain films with different hydrogen (H) diffusivities, for example, different capabilities of blocking hydrogen (H) diffusion. For example, as shown in FIGS. 6-9, the first source/drain pattern 150 may include the lower source/drain pattern 151 and the upper source/drain pattern 152, which have different materials and may also have different shapes from each other, to control the hydrogen (H) diffusion. Thus, the infiltration of impurities (e.g., hydrogen (H)) into the metal oxide layer 110 along the contact 180 or the like may be reduced or suppressed. Degradation of transistor performance due to short channel effect may then be prevented or reduced. Accordingly, performance and reliability of the semiconductor device may be enhanced.

Figure 10:
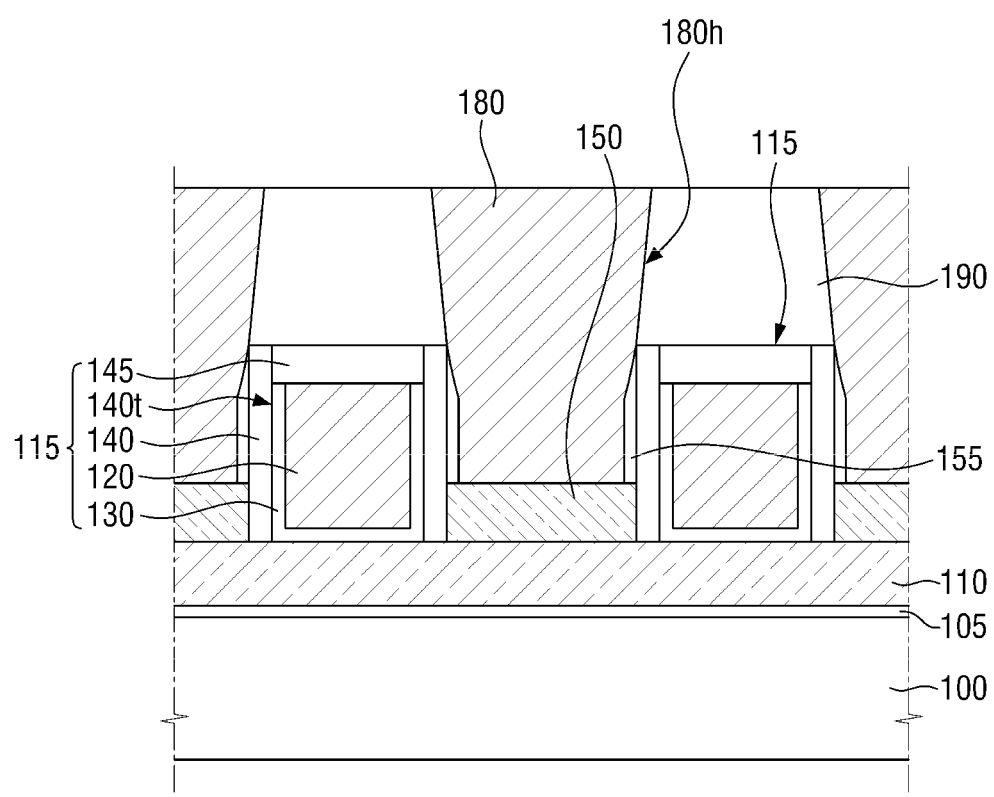
FIG. 10 is a diagram illustrating a semiconductor device according to an exemplary embodiment of the present inventive concept.

FIG. 10 is a diagram illustrating a semiconductor device according to an exemplary embodiment of the present inventive concept. For simplicity of description, the following description will focus on differences from the description with reference to FIG. 1.

Referring to FIG. 10, a semiconductor device according to an exemplary embodiment of the present inventive concept may further include a source/drain pattern liner 155 formed on the first source/drain pattern 150.

The source/drain pattern liner 155 may be disposed on the top surface of the first source/drain pattern 150, and may be disposed between the first gate structure 115 and the contact 180.

The source/drain pattern liner 155 may extend along the sidewall of the first gate structure 115. For example, the source/drain pattern liner 155 may extend along the sidewall of an adjacent one of the gate spacers 140, and may be disposed between the adjacent one of the gate spacers 140 and the contact 180.

The source/drain pattern liner 155 may include an insulating material. The source/drain pattern liner 155 may include a material having an etch selectivity with respect to the interlayer insulating layer 190 and/or a material for preventing hydrogen diffusion. The source/drain pattern liner 155 may serve as an etch stop layer when the contact hole 180h is formed. Alternatively, the source/drain pattern liner 155 may serve as a hydrogen diffusion prevention layer to prevent hydrogen from diffusing into the metal oxide layer 110. Thus, in addition to the first source/drain pattern 150, the source/drain pattern liner 155 may further reduce or suppress the infiltration of impurities (e.g., hydrogen (H)) into the metal oxide layer 110 through the interface between the contact 180 and the gate spacer 140. Degradation of transistor performance due to short channel effect may then be prevented or reduced. Accordingly, performance and reliability of the semiconductor device may be enhanced.

The source/drain pattern liner 155 may include at least one of, for example, silicon nitride ($Si_3N_4$), silicon oxynitride (SiON), silicon carbonitride (SiCN), silicon oxide ($SiO_2$), silicon oxycarbonitride (SiOCN) and aluminum oxide ($Al_2O_3$).

Figure 11:
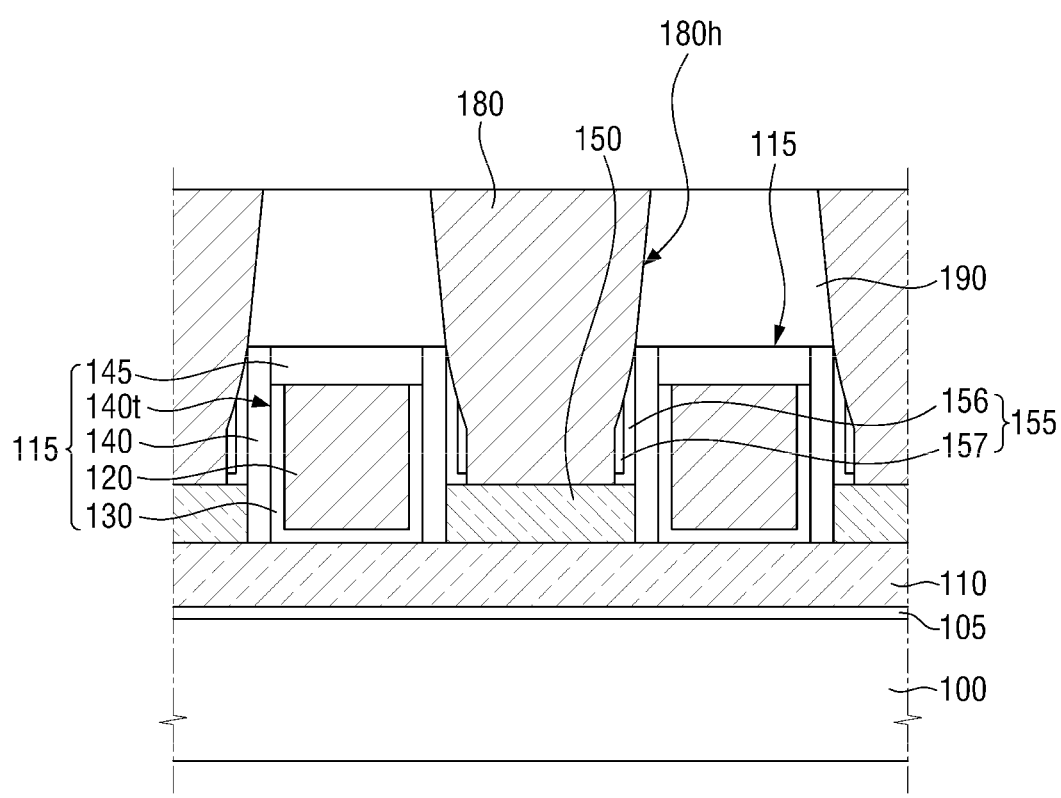
FIG. 11 is a diagram illustrating a semiconductor device according to an exemplary embodiment of the present inventive concept.
Figure 12:
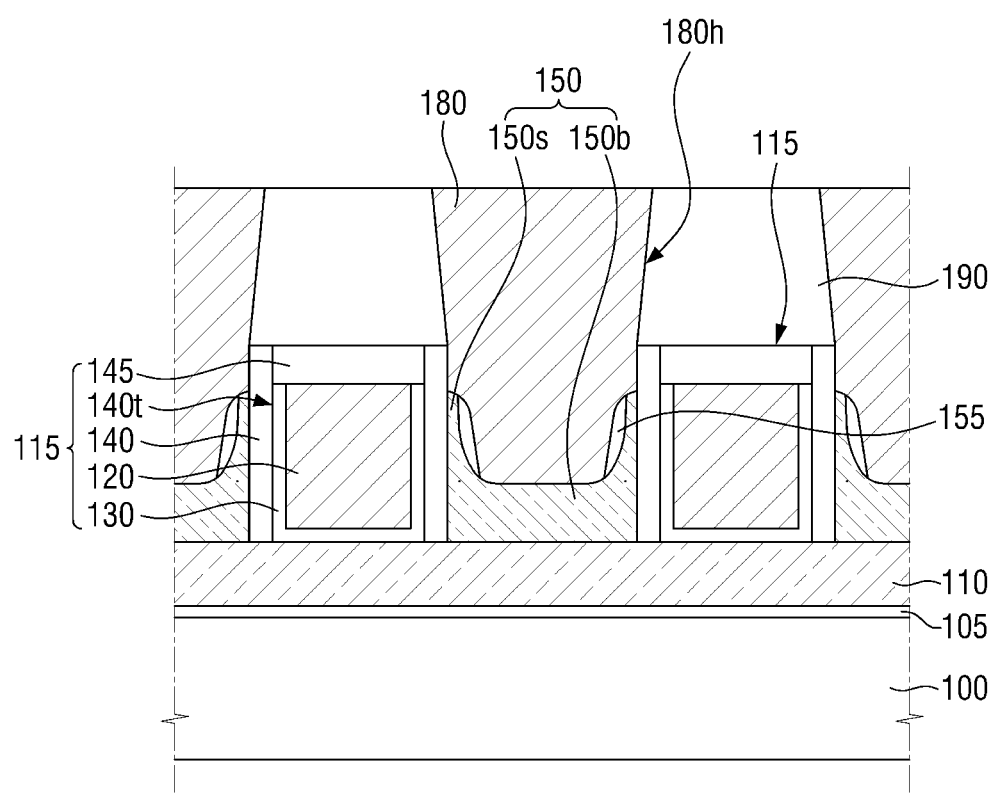
FIG. 12 is a diagram illustrating a semiconductor device according to an exemplary embodiment of the present inventive concept.

FIG. 11 is a diagram illustrating a semiconductor device according to an exemplary embodiment of the present inventive concept. FIG. 12 is a diagram illustrating a semiconductor device according to an exemplary embodiment of the present inventive concept. For simplicity of description, the following description will focus on differences from the description with reference to FIG. 10.

Referring to FIG. 11, in a semiconductor device according to an exemplary embodiment of the present inventive concept, the source/drain pattern liner 155 may include a lower liner 156 and an upper liner 157.

The lower liner 156 may extend along the sidewall of the first gate structure 115. The upper liner 157 may be formed on the lower liner 156 and may extend along the sidewall of the first gate structure 115. The lower liner 156 may be disposed between the first gate structure 115 and the upper liner 157.

As an example, the lower liner 156 may be an etch stop liner, and the upper liner 157 may be a hydrogen diffusion prevention liner. As another example, the lower liner 156 may be a hydrogen diffusion prevention liner, and the upper liner 157 may be an etch stop liner. In other words, the source/drain pattern liner 155 may include an etch stop liner and a hydrogen diffusion prevention liner. In an exemplary embodiment of the present inventive concept, the etch stop liner may include a material which is also capable of preventing hydrogen (H) diffusion. Thus, in addition to the first source/drain pattern 150, the lower liner 156 and/or the upper liner 157 may further reduce or suppress the infiltration of impurities (e.g., hydrogen (H)) into the metal oxide layer 110 through the interface between the contact 180 and the gate spacer 140. Degradation of transistor performance due to short channel effect may then be prevented or reduced. Accordingly, performance and reliability of the semiconductor device may be enhanced.

The etch stop liner may include at least one of, for example, silicon nitride ($Si_3N_4$), silicon oxynitride (SiON), silicon carbonitride (SiCN), silicon oxide ($SiO_2$) and silicon oxycarbonitride (SiOCN), but the present inventive concept is not limited thereto. The hydrogen diffusion prevention liner may include, for example, aluminum oxide ($Al_2O_3$), but the present inventive concept is not limited thereto.

Referring to FIG. 12, in a semiconductor device according to an exemplary embodiment of the present inventive concept, the source/drain pattern liner 155 may extend along a portion of the top surface of the first source/drain pattern 150.

The first source/drain pattern 150 may include a bottom portion 150b and sidewall portions 150s. The source/drain pattern liner 155 may extend along the sidewall portion 150s of the first source/drain pattern.

The sidewall portion 150s of the first source/drain pattern may be disposed between the source/drain pattern liner 155 and the first gate structure 115.

Figure 13:
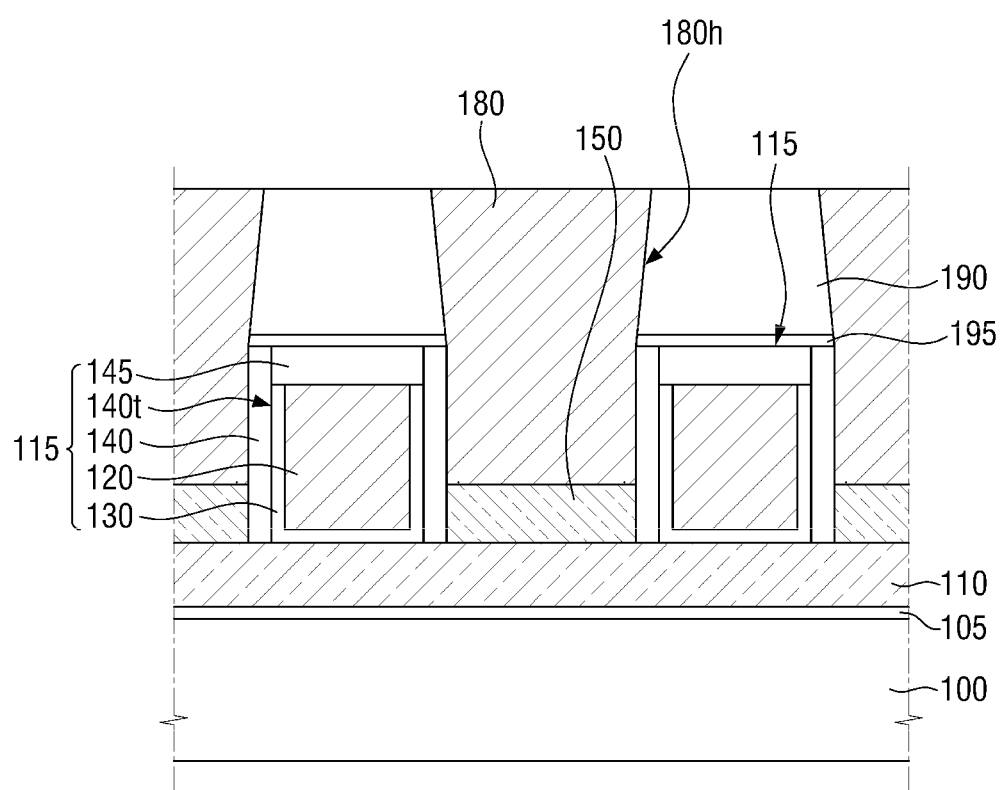
FIG. 13 is a diagram illustrating a semiconductor device according to an exemplary embodiment of the present inventive concept.

FIG. 13 is a diagram illustrating a semiconductor device according to an exemplary embodiment of the present inventive concept. For simplicity of description, the following description will focus on differences from the description with reference to FIG. 1.

Referring to FIG. 13, a semiconductor device according to an exemplary embodiment of the present inventive concept may further include a hydrogen diffusion prevention layer 195 extending along the top surface of the first gate structure 115.

A portion of the interlayer insulating layer 190 may be formed before the hydrogen diffusion prevention layer 195 is formed. The remaining portion of the interlayer insulating layer 190 may be formed on the hydrogen diffusion prevention layer 195.

The contact 180 may be formed to pass through the hydrogen diffusion prevention layer 195 and the interlayer insulating layer 190 on the hydrogen diffusion prevention layer 195. Thus, in addition to the first source/drain pattern 150, the hydrogen diffusion prevention layer 195 may further reduce or suppress the infiltration of impurities (e.g., hydrogen (H)) into the metal oxide layer 110 through the interface between the contact 180 and the gate spacer 140. Degradation of transistor performance due to short channel effect may then be prevented or reduced. Accordingly, performance and reliability of the semiconductor device may be enhanced.

The hydrogen diffusion prevention layer 195 may include, for example, aluminum oxide ($Al_2O_3$), but the present inventive concept is not limited thereto.

Figure 14:
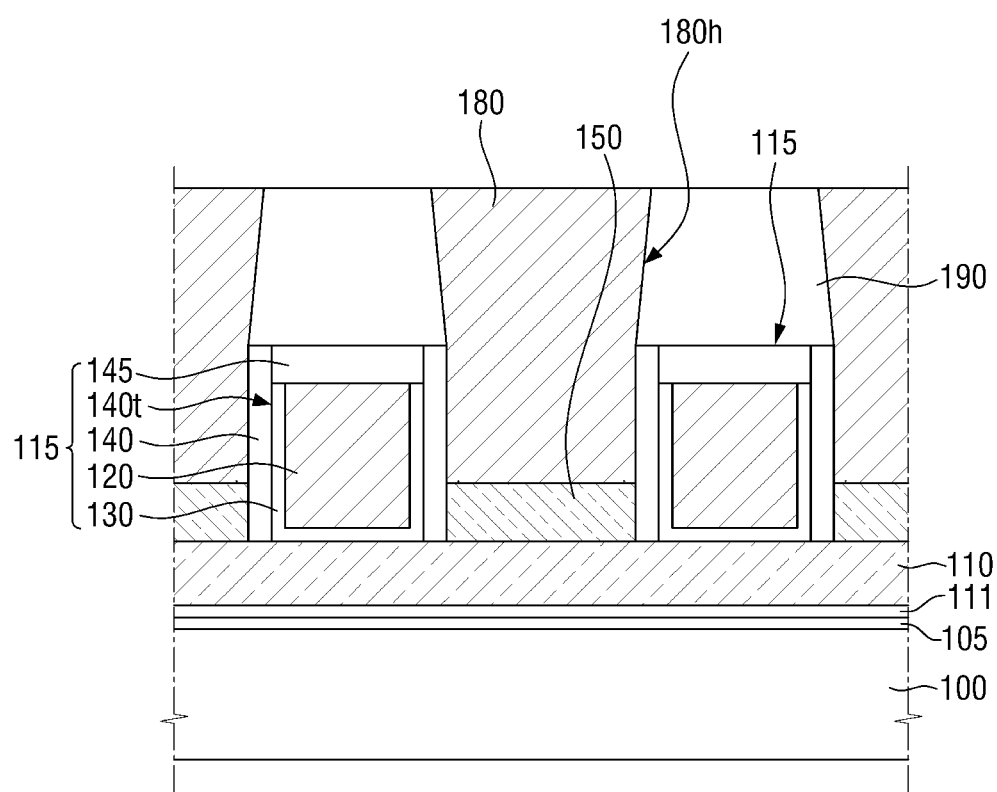
FIG. 14 is a diagram illustrating a semiconductor device according to an exemplary embodiment of the present inventive concept.

FIG. 14 is a diagram illustrating a semiconductor device according to an exemplary embodiment of the present inventive concept. For simplicity of description, the following description will focus on differences from the description with reference to FIG. 1.

Referring to FIG. 14, a semiconductor device according to an exemplary embodiment of the present inventive concept may further include a buried liner layer 111 disposed between the metal oxide layer 110 and the substrate 100. For example, the buried liner layer 111 may be disposed between the metal oxide layer 110 and the buffer insulating layer 105.

The buried liner layer 111 may be formed along the buffer insulating layer 105, and may be in contact with the metal oxide layer 110. The buried liner layer 111 may serve to induce crystallization of the metal oxide layer 110 during a manufacturing process.

The buried liner layer 111 may include a transition metal. The transition metal may include at least one of, for example, tantalum (Ta), titanium (Ti), molybdenum (Mo) and a combination thereof.

The buried liner layer 111 may include at least one of, for example, tantalum oxide ($Ta_2O_5$), tantalum oxynitride (TaON), titanium oxide ($TiO_2$), titanium oxynitride (TiON), molybdenum oxide ($MoO_3$) and molybdenum oxynitride (MoON).

Figure 15:
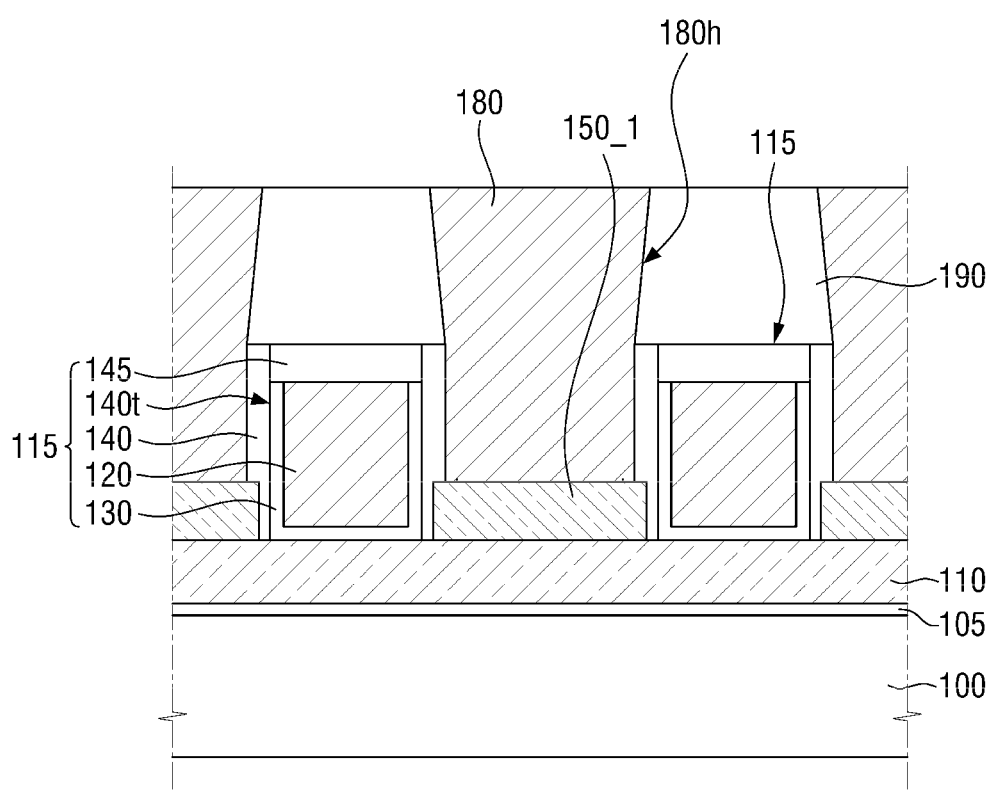
FIG. 15 is a diagram illustrating a semiconductor device according to an exemplary embodiment of the present inventive concept.

FIG. 15 is a diagram illustrating a semiconductor device according to an exemplary embodiment of the present inventive concept. For simplicity of description, the following description will focus on differences from the description with reference to FIG. 1.

Referring to FIG. 15, a semiconductor device according to an exemplary embodiment of the present inventive concept may include a second source/drain pattern 150_1.

A portion of the first gate structure 115 may be placed on the second source/drain pattern 150_1. For example, a portion of the gate spacer 140 may be placed on the second source/drain pattern 150_1. In other words, a portion of the gate spacer 140 may extend along the top surface of second source/drain pattern 150_1. For example, the gate spacer 140 may include a portion extending along the top surface of second source/drain pattern 150_1.

The second source/drain pattern 150_1 may include at least one of an element semiconductor material pattern and a group IV-IV compound semiconductor material pattern.

The second source/drain pattern 150_1 may include a dopant doped into the second source/drain pattern 150_1. The dopant may include at least one of phosphorus (P), arsenic (As), antimony (Sb) and boron (B). For example, the dopant may be included in the element semiconductor material pattern or the group IV-IV compound semiconductor material pattern to modulate electrical properties, and may convert an intrinsic semiconductor property of the element semiconductor material pattern or the group IV-IV compound semiconductor material pattern into a conductor property.

Compared to FIG. 1, the second source/drain pattern 150_1 may replace the first source/drain pattern 150. The second source/drain pattern 150_1 may increase a separation distance between the contact 180 and the metal oxide layer 110. By increasing the separation distance between the contact 180 and the metal oxide layer 110, the infiltration of impurities (e.g., hydrogen (H)) into the metal oxide layer 110 along the contact 180 or the like may be reduced or suppressed. Degradation of transistor performance due to short channel effect may then be prevented or reduced. Accordingly, performance and reliability of the semiconductor device may be enhanced.

Figure 16:
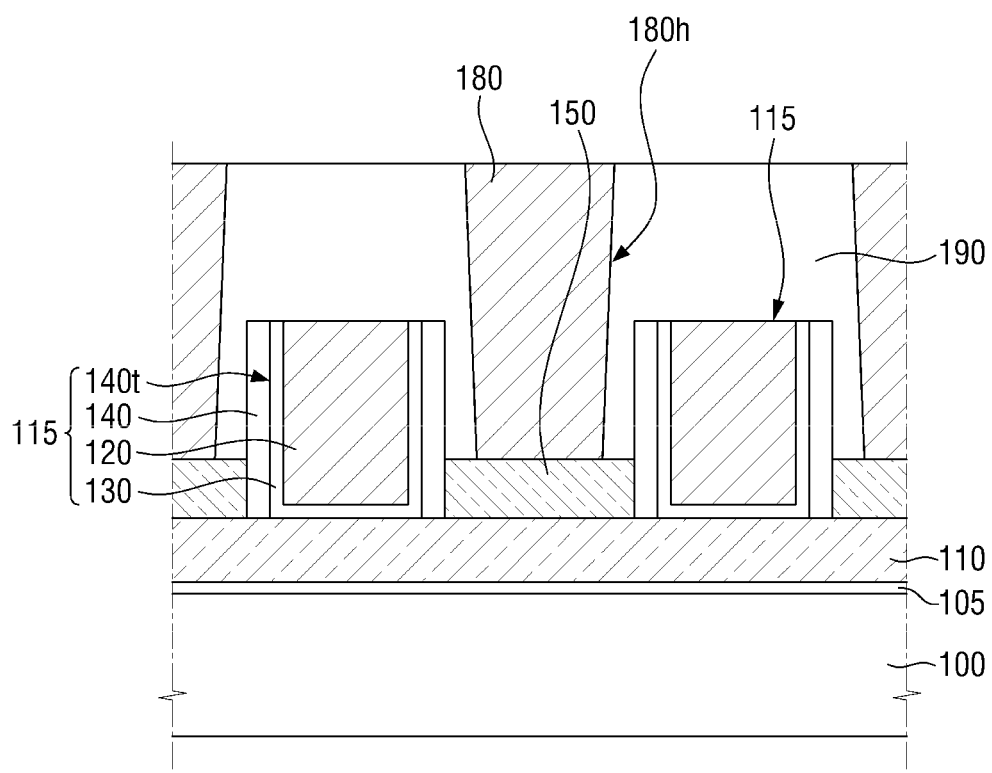
FIG. 16 is a diagram illustrating a semiconductor device according to an exemplary embodiment of the present inventive concept.
Figure 17:
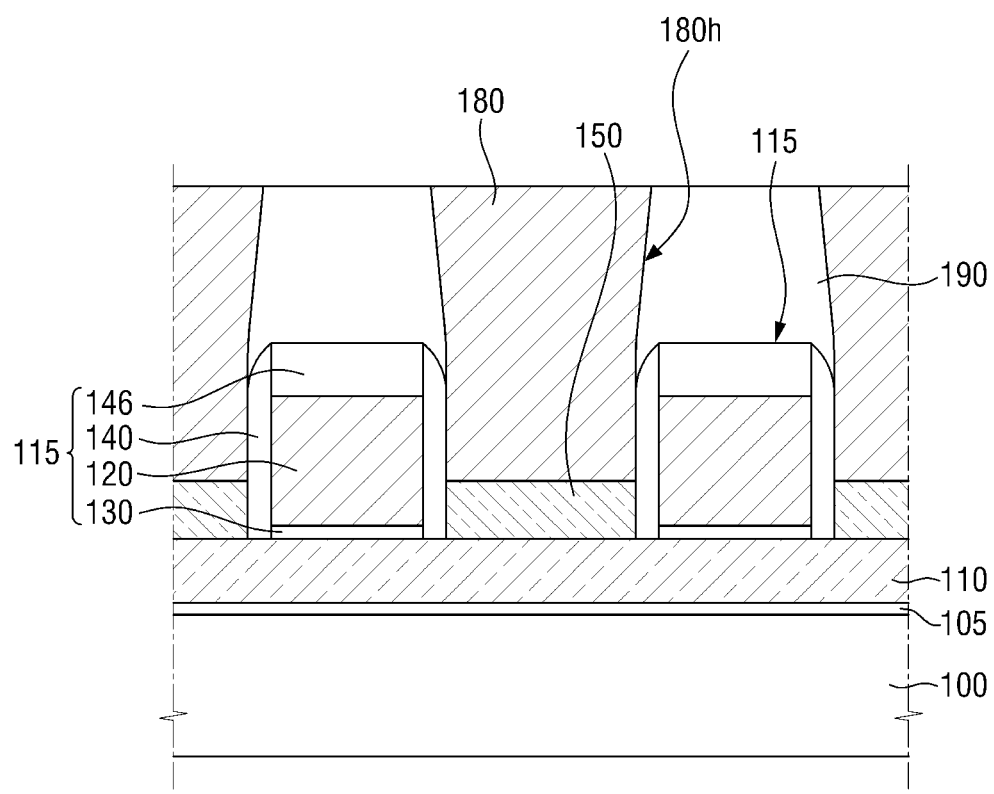
FIG. 17 is a diagram illustrating a semiconductor device according to an exemplary embodiment of the present inventive concept.

FIG. 16 is a diagram illustrating a semiconductor device according to an exemplary embodiment of the present inventive concept. FIG. 17 is a diagram illustrating a semiconductor device according to an exemplary embodiment of the present inventive concept. For simplicity of description, the following description will focus on differences from the description with reference to FIG. 1.

Referring to FIG. 16, in a semiconductor device according to an exemplary embodiment of the present inventive concept, the first gate structure 115 does not include the capping pattern 145 of FIG. 1.

The first gate structure 115 may include the gate electrode 120, the first insulating material layer 130 and the gate spacers 140.

Referring to FIG. 17, in a semiconductor device according to an exemplary embodiment of the present inventive concept, the first gate structure 115 may include the gate electrode 120, the first insulating material layer 130, the gate spacers 140 and a blocking insulating layer 146.

The first insulating material layer 130, the gate electrode 120 and the blocking insulating layer 146 may be stacked on the metal oxide layer 110 in a plate shape.

The first insulating material layer 130 does not extend between the sidewall of the gate electrode 120 and the inner sidewall of the gate spacer 140.

The blocking insulating layer 146 may include at least one of, for example, silicon oxide ($SiO_2$), silicon oxynitride (SiON) and silicon nitride ($Si_3N_4$).

Figure 18:
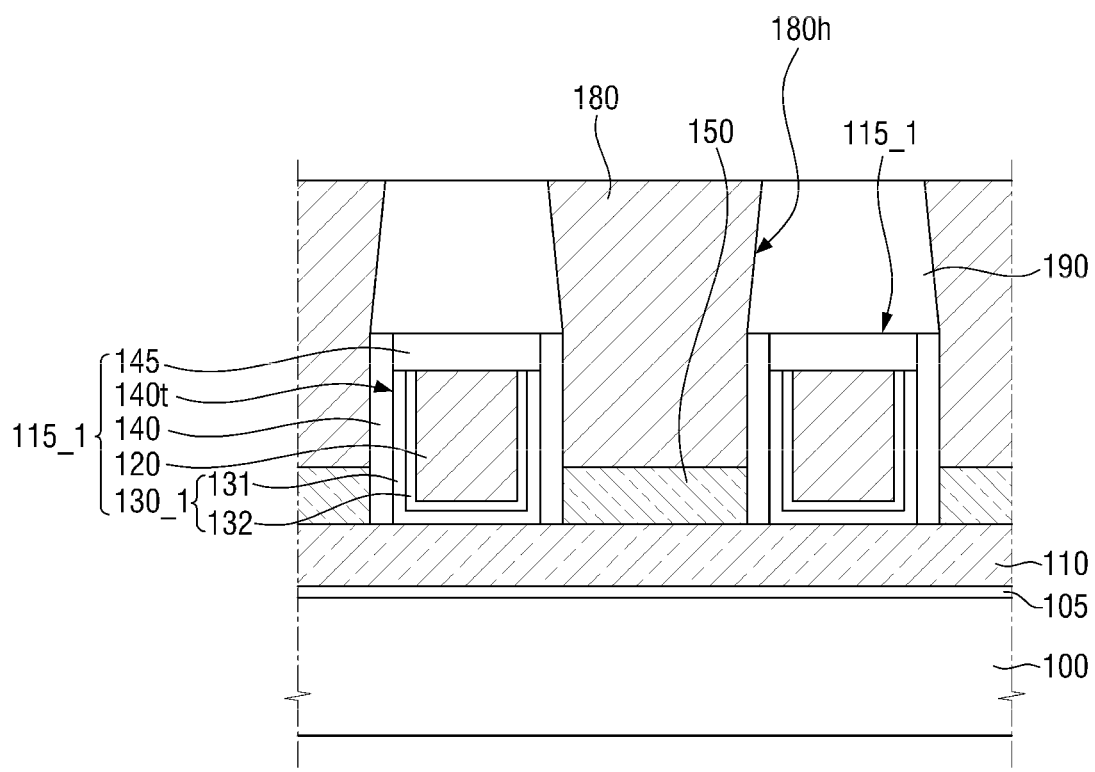
FIG. 18 is a diagram illustrating a semiconductor device according to an exemplary embodiment of the present inventive concept.

FIG. 18 is a diagram illustrating a semiconductor device according to an exemplary embodiment of the present inventive concept. For simplicity of description, the following description will focus on differences from the description with reference to FIG. 1.

Referring to FIG. 18, in a semiconductor device according to an exemplary embodiment of the present inventive concept, a second gate structure 115_1 may include the gate electrode 120, a second insulating material layer 130_1, the gate spacers 140 and the capping pattern 145.

Since the gate electrode 120, the gate spacers 140 and the capping pattern 145 are the same as those described above, a description thereof will be omitted.

The second insulating material layer 130_1 may include a first paraelectric material layer 131 and a ferroelectric material layer 132. The second insulating material layer 130_1 is disposed on the metal oxide layer 110 and is in contact with the metal oxide layer 110. The second insulating material layer 130_1 may extend along the sidewalls and bottom surface of the gate trench 140t. The first paraelectric material layer 131 and the ferroelectric material layer 132 may be sequentially stacked on the metal oxide layer 110. The ferroelectric material layer 132 may control much larger charge density than the first paraelectric material layer 131, and may be used to form a ferroelectric transistor.

The first paraelectric material layer 131 is disposed on the metal oxide layer 110 and is in contact with the metal oxide layer 110. The first paraelectric material layer 131 may extend along the sidewalls and bottom surface of the gate trench 140t.

The ferroelectric material layer 132 may be disposed on the first paraelectric material layer 131. The ferroelectric material layer 132 may be formed along the profile of the first paraelectric material layer 131. The gate electrode 120 may be disposed on the ferroelectric material layer 132.

The first paraelectric material layer 131 may include, for example, silicon oxide ($SiO_2$). That is, the first paraelectric material layer 131 may include, for example, a silicon oxide ($SiO_2$) layer.

The ferroelectric material layer 132 may have ferroelectric characteristics. The ferroelectric material layer 132 may have a thickness thick enough to have ferroelectric characteristics. The thickness range of the ferroelectric material layer 132 having ferroelectric characteristics may vary depending on the ferroelectric material included in the ferroelectric material layer 132.

The ferroelectric material layer 132 may include monometal oxide. For example, the ferroelectric material layer 132 may include a monometal oxide layer. Here, the monometal oxide may be a binary compound composed of one metal and oxygen.

As an example, the metal included in the monometal oxide layer may be hafnium (Hf). For example, the monometal oxide layer may be a hafnium oxide ($HfO_2$) layer. Here, the hafnium oxide ($HfO_2$) layer may have a chemical formula that conforms to stoichiometry, or may have a chemical formula that does not conform to stoichiometry.

As another example, the metal included in the monometal oxide layer may be one of rare earth metals belonging to lanthanoids. The monometal oxide layer may be a rare earth metal (belonging to lanthanoids) oxide layer. Here, the rare earth metal (belonging to lanthanoids) oxide layer may have a chemical formula that conforms to stoichiometry, or may have a chemical formula that does not conform to stoichiometry.

The ferroelectric material layer 132 may further include a dopant doped into the monometal oxide layer. The doping concentration may vary depending on the type of dopant, but the doping concentration of the dopant included in the ferroelectric material layer 132 may be 10% or less.

As an example, when the monometal oxide layer is a hafnium oxide layer, the dopant may include at least one of, for example, gadolinium (Gd), silicon (Si), aluminum (Al), yttrium (Y), lanthanum (La), scandium (Sc), cerium (Ce), dysprosium (Dy), tantalum (Ta), strontium (Sr) and niobium (Nb). As another example, when the monometal oxide layer is a rare earth metal (belonging to lanthanoids) oxide layer, the dopant may include at least one of, for example, silicon (Si), aluminum (Al), hafnium (Hf), zirconium (Zr), and niobium (Nb).

As another example, the ferroelectric material layer 132 may not include a dopant doped into the monometal oxide layer.

When the ferroelectric material layer 132 includes a monometal oxide layer, the ferroelectric material layer 132 may have a thickness of, for example, 1 nm or more and 10 nm or less.

The ferroelectric material layer 132 may include bimetal oxide. For example, the ferroelectric material layer 132 may include a bimetal oxide layer. Here, the bimetal oxide may be a ternary compound composed of two metals and oxygen.

The metals included in the bimetal oxide layer may be, for example, hafnium (Hf) and zirconium (Zr). The bimetal oxide layer may be a hafnium zirconium oxide ($Hf_xZr_{(1-x)}O$) layer. In the bimetal oxide layer, x may be 0.2 or more and 0.8 or less. Here, the hafnium zirconium oxide ($Hf_xZr_{(1-x)}O$) layer may have a chemical formula that conforms to stoichiometry, or may have a chemical formula that does not conform to stoichiometry.

As an example, the ferroelectric material layer 132 may further include a dopant doped into the bimetal oxide layer. The dopant may include at least one of, for example, gadolinium (Gd), silicon (Si), aluminum (Al), yttrium (Y), lanthanum (La), scandium (Sc), cerium (Ce), dysprosium (Dy), tantalum (Ta) and strontium (Sr). As another example, the ferroelectric material layer 132 may not include a dopant doped into the bimetal oxide layer.

When the ferroelectric material layer 132 includes a bimetal oxide layer, the ferroelectric material layer 132 may have a thickness of, for example, 1 nm or more and 20 nm or less.

The paraelectric material may have a positive dielectric constant, and the ferroelectric material may have a negative dielectric constant within a predetermined range. That is, the paraelectric material may have a positive capacitance, and the ferroelectric material may have a negative capacitance.

Generally, when two or more capacitors having a positive capacitance are connected in series, the sum of the capacitances decreases. However, when a negative capacitor having a negative capacitance and a positive capacitor having a positive capacitance are connected in series, the sum of the capacitances increases.

By using such characteristics, a subthreshold swing (SS) of the transistor can be enhanced.

The second insulating material layer 130_1 may be applied to the semiconductor device described with reference to FIGS. 2 to 17. Thus, the infiltration of impurities (e.g., hydrogen (H)) into the metal oxide layer 110 along the contact 180 and/or the interface between the gate spacer 140 and the contact 180 may be reduced or suppressed through the source/drain engineering, and at the same time, the second insulating material layer 130_1 may include the first paraelectric material layer 131 and the ferroelectric material layer 132 to obtain negative capacitance. Accordingly, performance and reliability of the semiconductor device may be enhanced.

Figure 19:
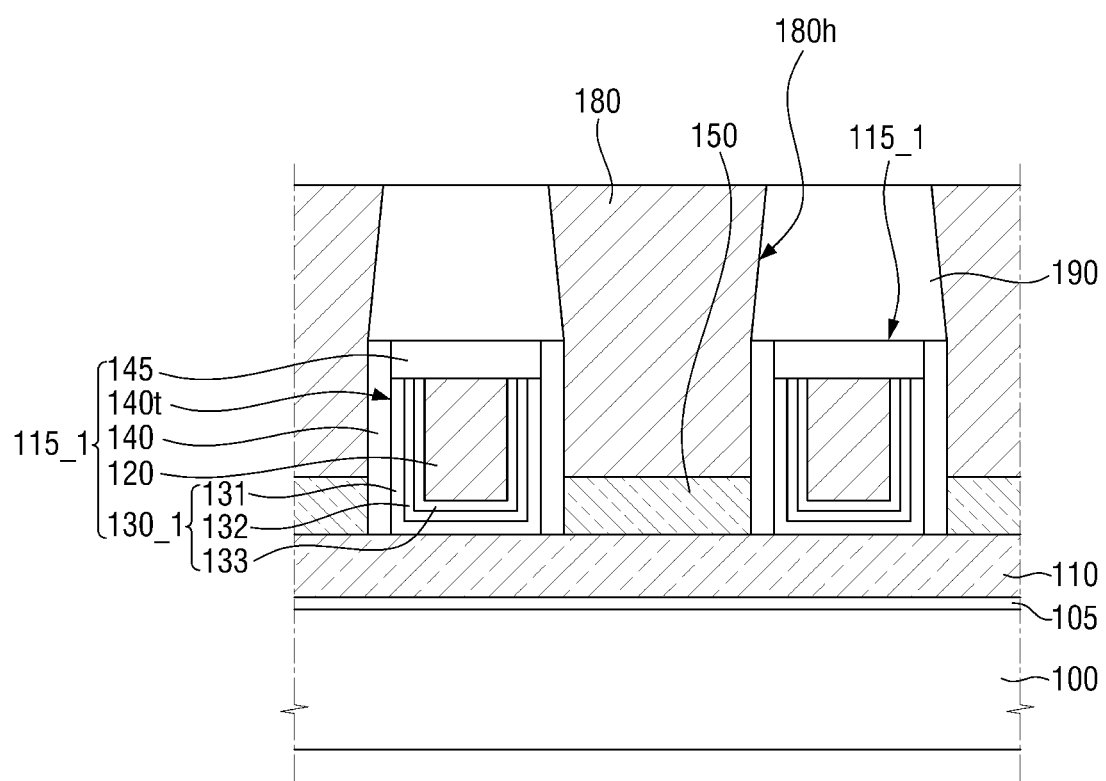
FIG. 19 is a diagram illustrating a semiconductor device according to an exemplary embodiment of the present inventive concept.

FIG. 19 is a diagram illustrating a semiconductor device according to an exemplary embodiment of the present inventive concept. For simplicity of description, the following description will focus on differences from the description with reference to FIG. 18.

Referring to FIG. 19, in a semiconductor device according to an exemplary embodiment of the present inventive concept, the second insulating material layer 130_1 may further include a second paraelectric material layer 133.

The second paraelectric material layer 133 may be disposed on the ferroelectric material layer 132. The ferroelectric material layer 132 may be disposed between the first paraelectric material layer 131 and the second paraelectric material layer 133.

The second paraelectric material layer 133 may include, for example, silicon oxide ($SiO_2$) or aluminum oxide ($Al_2O_3$). That is, the second paraelectric material layer 133 may include at least one of, for example, a silicon oxide ($SiO_2$) layer and an aluminum oxide ($Al_2O_3$) layer.

The second insulating material layer 130_1 shown in FIG. 19 may be applied to the semiconductor device described with reference to FIGS. 2 to 17. Thus, the infiltration of impurities (e.g., hydrogen (H)) into the metal oxide layer 110 along the contact 180 and/or the interface between the gate spacer 140 and the contact 180 may be reduced or suppressed through the source/drain engineering, and at the same time, the second insulating material layer 130_1 may include the first paraelectric material layer 131, the ferroelectric material layer 132 and the second paraelectric material layer 133 to obtain negative capacitance. Accordingly, performance and reliability of the semiconductor device may be enhanced.

Figure 20:
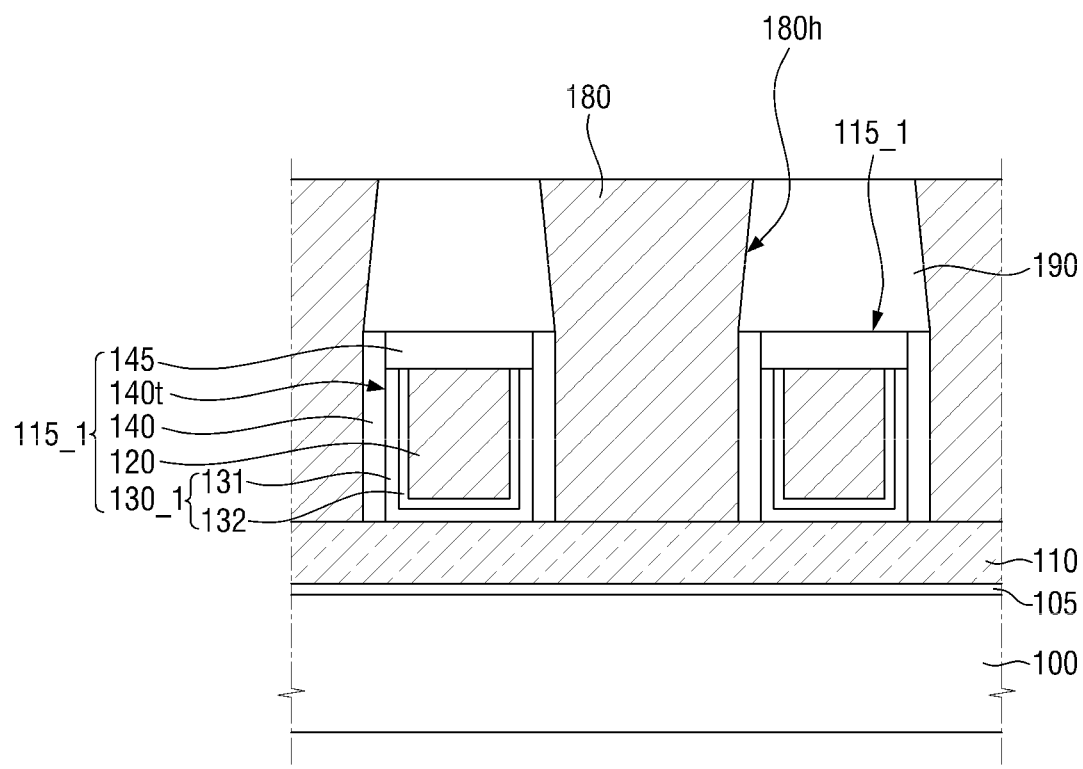
FIG. 20 is a diagram illustrating a semiconductor device according to an exemplary embodiment of the present inventive concept.
Figure 21:
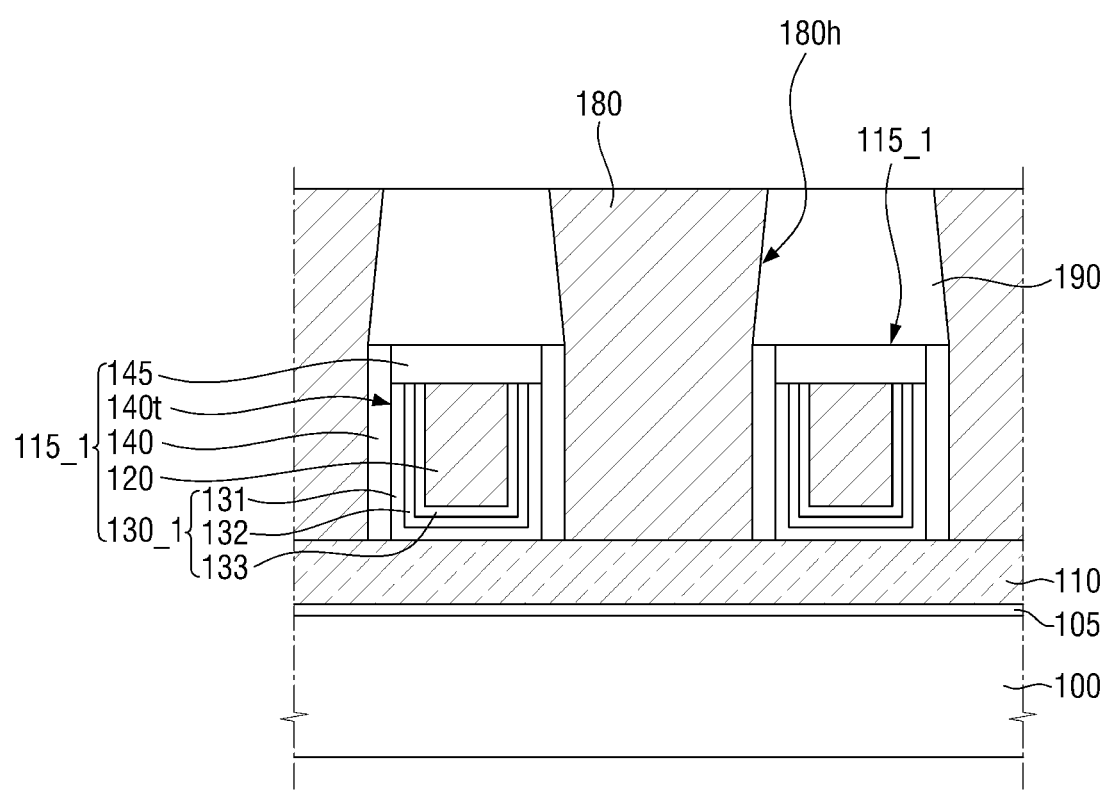
FIG. 21 is a diagram illustrating a semiconductor device according to an exemplary embodiment of the present inventive concept.

FIG. 20 is a diagram illustrating a semiconductor device according to an exemplary embodiment of the present inventive concept. FIG. 21 is a diagram illustrating a semiconductor device according to an exemplary embodiment of the present inventive concept. For simplicity of description, the description of FIG. 20 will focus on differences from the description with reference to FIG. 18, and the description of FIG. 21 will focus on differences from the description with reference to FIG. 19.

Referring to FIGS. 20 and 21, in a semiconductor device according to an exemplary embodiment of the present inventive concept, the contact 180 may be in contact with the metal oxide layer 110. The source/drain pattern (150 in FIGS. 1 and 150_1 in FIG. 15) may not be formed between the contact 180 and the metal oxide layer 110.

The contact 180 may be directly connected to the metal oxide layer 110 instead of being connected to the metal oxide layer 110 via the first source/drain pattern (150 in FIGS. 18 and 19). Since the second insulating material layer 130_1 may include the first paraelectric material layer 131 and the ferroelectric material layer 132, or may include the first paraelectric material layer 131, the ferroelectric material layer 132 and the second paraelectric material layer 133, negative capacitance may be obtained. Accordingly, performance of the semiconductor device may be enhanced.

In concluding the detailed description, those skilled in the art will appreciate that many variations and modifications may be made to the preferred exemplary embodiments without departing from the spirit and scope of the present inventive concept as defined in the appended claims. Therefore, the disclosed preferred exemplary embodiments of the present inventive concept are used in a generic and descriptive sense only and not for purposes of limitation.

What is claimed is:

1. A semiconductor device comprising:
a substrate;
a metal oxide layer disposed on the substrate;
a gate structure disposed on the metal oxide layer, the gate structure including an insulating material layer and a gate electrode disposed on the insulating material layer, the insulating material layer including a ferroelectric material layer;
an interlayer insulating layer covering the gate structure and disposed on the metal oxide layer; and
a contact disposed in the interlayer insulating layer and connected to the metal oxide layer,
wherein the gate structure includes gate spacers defining a gate trench,
wherein the ferroelectric material layer extends along sidewalls and a bottom surface of the gate trench,
wherein a top surface of the ferroelectric material layer is lower than a top surface of the gate spacers, and
the contact is in direct contact with the gate spacers.

2. The semiconductor device of claim 1, wherein the insulating material layer includes a first paraelectric material layer being in contact with the metal oxide layer, and the ferroelectric material layer disposed on the first paraelectric material layer.

3. The semiconductor device of claim 2, wherein the insulating material layer further includes a second paraelectric material layer disposed on the ferroelectric material layer.

4. The semiconductor device of claim 3, wherein the second paraelectric material layer includes at least one of an aluminum oxide layer and a silicon oxide layer.

5. The semiconductor device of claim 1, wherein the gate structure further includes a capping pattern on the gate electrode.

6. The semiconductor device of claim 1, further comprising a source/drain pattern being in contact with the metal oxide layer and disposed on at least one side of the gate structure,
wherein at least a portion of the source/drain pattern protrudes upward from a top surface of the metal oxide layer, and
the contact is connected to the source/drain pattern.

7. The semiconductor device of claim 6, wherein the source/drain pattern includes a bottom portion extending along a top surface of the substrate and a sidewall portion protruding from the bottom portion and extending along a sidewall of the gate structure.

8. The semiconductor device of claim 6, wherein the metal oxide layer includes a source/drain recess formed on at least one side of the gate structure, and
wherein a portion of the source/drain pattern fills the recess.

9. A semiconductor device comprising:
a substrate;
a metal oxide layer disposed on the substrate;
a source/drain pattern being in contact with the metal oxide layer and including a portion protruding from a top surface of the metal oxide layer;
a plurality of gate structures disposed on the metal oxide layer with the source/drain pattern interposed therebetween, and each of the gate structures including gate spacers and an insulating material layer, the insulating material layer being in contact with the metal oxide layer, and not extending along a top surface of the source/drain pattern; and
a contact disposed on the source/drain pattern, the contact being connected to the source/drain pattern,
wherein the source/drain pattern is in contact with the gate spacers,
wherein the insulating material layer includes a paraelectric material layer and a ferroelectric material layer on the metal oxide layer, and
wherein the insulating material layer is in direct contact with the gate spacers and does not overlap the gate spacers in a direction perpendicular to a top surface of the substrate.

10. The semiconductor device of claim 9, wherein the source/drain pattern includes sidewall portions extending along sidewalls of the gate structures and a bottom portion extending along a top surface of the substrate.

11. The semiconductor device of claim 9, wherein the source/drain pattern includes a lower source/drain pattern and an upper source/drain pattern on the lower source/drain pattern, and the lower source/drain pattern and the upper source/drain pattern have at least one of different materials and different shapes from each other.

12. The semiconductor device of claim 9, wherein the metal oxide layer includes one of In—Ga-based oxide, In—Zn-based oxide and In—Ga—Zn-based oxide.

13. The semiconductor device of claim 9, wherein the source/drain pattern includes at least one of silicon (Si), silicon germanium (SiGe), silicon carbide (SiC), germanium (Ge), indium tin oxide (ITO), indium zinc oxide (IZO) and InGaSiO.

14. The semiconductor device of claim 9, wherein the gate spacers define a gate trench, and wherein the ferroelectric material layer extends along sidewalls and a bottom surface of the gate trench.

15. A semiconductor device comprising:

a silicon substrate;

a buffer insulating layer disposed on the silicon substrate, the buffer insulating layer extending along a top surface of the silicon substrate;

a metal oxide layer disposed on the buffer insulating layer, the metal oxide layer including In—Ga—Zn-based oxide;

a plurality of gate structures spaced apart from each other, each of the gate structures including a gate electrode, an insulating material layer and a capping pattern on the gate electrode and the insulating material layer, and the insulating material layer includes a paraelectric material layer and a ferroelectric material layer sequentially stacked on the metal oxide layer;

a source/drain pattern disposed between the gate structures, the source/drain pattern being in contact with the metal oxide layer and including sidewall portions extending along sidewalls of the gate structures and a bottom portion extending along the top surface of the silicon substrate;

an interlayer insulating layer covering the source/drain pattern and the gate structures and including a contact hole exposing at least a portion of the source/drain pattern; and a contact filling the contact hole and connected to the source/drain pattern.

16. The semiconductor device of claim 15, wherein the source/drain pattern includes at least one of indium tin oxide (ITO), indium zinc oxide (IZO) and InGaSiO.

17. The semiconductor device of claim 15, wherein the metal oxide layer includes a source/drain recess formed between two adjacent ones of the gate structures, and a portion of the source/drain pattern fills the source/drain recess.

18. The semiconductor device of claim 17, wherein the two adjacent ones of the gate structures include gate spacers, and wherein a portion of the source/drain recess extends along bottom surfaces of the gate spacers.

19. The semiconductor device of claim 15, wherein each of the gate structures includes gate spacers defining a gate trench, and wherein each of the paraelectric material layer and the ferroelectric material layer extends along sidewalls and a bottom surface of the gate trench.

* * * * *